(12) United States Patent
Lee et al.

(10) Patent No.: US 12,555,515 B2
(45) Date of Patent: Feb. 17, 2026

(54) DISPLAY APPARATUS

(71) Applicant: LG DISPLAY CO., LTD., Seoul (KR)

(72) Inventors: Byunghyun Lee, Paju-si (KR); Hun Jang, Paju-si (KR); Yongmin Ha, Seoul (KR)

(73) Assignee: LG Display Co., Ltd., Seoul (KR)

( * ) Notice: Subject to any disclaimer, the term of this patent is extended or adjusted under 35 U.S.C. 154(b) by 52 days.

(21) Appl. No.: 18/420,452

(22) Filed: Jan. 23, 2024

(65) Prior Publication Data
US 2024/0257717 A1    Aug. 1, 2024

(30) Foreign Application Priority Data
Jan. 31, 2023 (KR) .................. 10-2023-0012882

(51) Int. Cl.
*G09G 3/32* (2016.01)
*H01L 25/075* (2006.01)
*H10H 20/857* (2025.01)

(52) U.S. Cl.
CPC ........... *G09G 3/32* (2013.01); *H01L 25/0753* (2013.01); *H10H 20/857* (2025.01); *G09G 2300/026* (2013.01); *G09G 2310/0267* (2013.01); *G09G 2310/0275* (2013.01); *G09G 2320/0223* (2013.01); *G09G 2320/0233* (2013.01); *G09G 2330/021* (2013.01)

(58) Field of Classification Search
CPC ............... G09G 3/32; G09G 2300/026; G09G 2310/0267; G09G 2310/0275; G09G 2320/0223; G09G 2320/0233; G09G 2330/021; H01L 25/0753; H10H 20/857; H10H 29/142; G09F 9/33; H05K 1/181; H05K 1/189; H05K 2201/10106; H10D 86/411; H10D 86/441
See application file for complete search history.

(56) References Cited

U.S. PATENT DOCUMENTS

| | | | |
|---|---|---|---|
| 2005/0146486 A1* | 7/2005 | Lim | G09G 3/3611 345/1.1 |
| 2007/0159441 A1* | 7/2007 | Yang | G09G 3/3677 345/99 |
| 2019/0393246 A1* | 12/2019 | Tung | H10D 86/60 |
| 2021/0202906 A1* | 7/2021 | Kim | H10K 59/18 |
| 2022/0223577 A1 | 7/2022 | Oh et al. | |

FOREIGN PATENT DOCUMENTS

| | | |
|---|---|---|
| KR | 10-2022-0069690 A | 5/2022 |
| KR | 10-2022-0076107 A | 6/2022 |

* cited by examiner

*Primary Examiner* — Patrick N Edouard
*Assistant Examiner* — Joseph P Fox
(74) *Attorney, Agent, or Firm* — Fenwick & West LLP

(57) ABSTRACT

Disclosed is a display apparatus in which a GIP circuit part is disposed in a panel part separate from a panel part including a pixel, such that decrease in a size of a transmissive area of the panel part including the pixel due to the GIP circuit part is minimized. Thus, a transmittance of the display apparatus embodied as a transparent display apparatus may be improved.

19 Claims, 15 Drawing Sheets

DISPLAY APPARATUS

CROSS-REFERENCE TO RELATED APPLICATION

This application claims the benefit of Republic of Korea Patent Application No. 10-2023-0012882, filed on Jan. 31, 2023, which is hereby incorporated by reference in its entirety.

BACKGROUND

Technical Field

The present disclosure relates to a display apparatus, and more particularly, to a display apparatus in which a plurality of panel units are bonded onto a wiring substrate in which a link line is disposed.

Description of Related Art

Display apparatuses are implemented in very diverse forms such as televisions, monitors, smart phones, tablet PCs, laptops, and wearable devices.

Among display apparatuses, a light-emitting type display apparatus has a light-emitting element or light source built therein, and may display information using light generated from the built-in light-emitting element or light source.

A display apparatus including a self-light-emitting element may be implemented to be thinner than a display apparatus having a light source built therein, and may be flexible, folded, bent, or rolled.

The display apparatus having the self-light-emitting element may include, for example, an organic light-emitting display apparatus (OLED; Organic Light-Emitting Diode Display) including a light-emitting layer made of an organic material, or a micro-LED display apparatus (Micro LED; Micro Light-Emitting Diode Display) including a light-emitting layer formed of an inorganic material, etc.

The micro-LED display apparatus includes the light-emitting layer made of the inorganic material that is resistant to moisture and oxygen, and thus has excellent reliability and a long lifespan compared to the display apparatus including a light-emitting layer made of an organic material.

Further, a micro-LED element of the micro-LED display apparatus not only lights up quickly, but also consumes smaller power and displays a high-luminance image. Thus, the micro-LED display apparatus is advantageously applied to an extra-large screen.

SUMMARY

A display apparatus may include a gate driver, a data driver, and a timing controller that drive a pixel of a display panel.

In this case, the gate driver may be composed of a plurality of gate ICs (integrated circuits) and may contact the display panel.

Recently, a gate-in-panel (GIP) scheme in which the gate driver is formed directly on the display panel has been widely used.

In the gate-in-panel scheme, a plurality of GIP circuit parts composed of thin-film transistors and a plurality of control signal lines to supply a clock signal to the GIP circuit parts together with a pixel array and a thin-film transistor array may be formed on the display panel.

The GIP circuit parts and various GIP signal lines may be disposed at one side or both sides of a non-display area out of a display area including the pixel array.

However, when the gate-in-panel scheme is applied to a tiling display apparatus in which a plurality of display panels are arranged in a tiling scheme, a boundary part between the tile display panels is visible due to the GIP circuit parts and the GIP signal lines disposed in the non-display area.

To solve this limitation, a gate-in-array (GIA) scheme may be used in which GIP circuit parts are disposed across the display area where the pixel array is disposed rather than in the non-display area.

However, when the gate-in-array (GIA) scheme is applied to a transparent display apparatus including a transmissive area, a size of the transmissive area is reduced due to the plurality of GIP circuit parts arranged in the display area, thereby reducing a transparency of the transparent display apparatus.

Accordingly, the inventors of the present disclosure have invented a display apparatus in which the problems that the boundary part between the tiling display panels is visible, and the size of the transmissive area is reduced due to the GIP circuit are resolved.

An aspect of the present disclosure is to provide a transparent display apparatus with improved transmittance.

Another aspect of the present disclosure is to provide a display apparatus in which an area size of the display area is increased.

Another aspect of the present disclosure is to provide a tiling display apparatus in which a bezel area is minimized so that a boundary part between panel parts is not visible.

Another aspect of the present disclosure is to provide a display apparatus that can easily implement a large screen.

Another aspect of the present disclosure is to provide a display apparatus in which a production cost of a wiring substrate onto which a plurality of panel parts are attached in a tiling manner is reduced.

Additional features and aspects will be set forth in the description that follows, and in part will be apparent from the description, or may be learned by practice of the inventive concepts provided herein. Other features and aspects of the inventive concepts may be realized and attained by the structure particularly pointed out in the written description, or derivable therefrom, and the claims hereof as well as the appended drawings.

To achieve these and other advantages and aspects of the present disclosure, as embodied and broadly described herein, a display apparatus comprises a wiring substrate including a plurality of pixel gate link lines, at least one first panel part disposed on the wiring substrate including a plurality of GIP circuit parts and electrically connected to the pixel gate link lines, and at least one second panel part disposed on the wiring substrate including a plurality of pixels and electrically connected to the pixel gate link lines. A gate signal output from the first panel part may be transmitted to the second panel part by the pixel gate link lines.

In another aspect, a display apparatus comprises a wiring substrate including a plurality of first gate link lines and a plurality of second gate link lines, a circuit film disposed on one portion of the wiring substrate and configured to transmit a gate control signal to the plurality of first gate link lines, at least one first panel part disposed on the wiring substrate, one portion of the at least one first panel part being electrically connected to the first gate link lines, and the other portion thereof being electrically connected to the second gate link lines, and at least one second panel part disposed on the wiring substrate sand electrically connected to the second gate link lines.

In another aspect, a display apparatus comprises a wiring substrate including a plurality of gate link lines, at least one first panel part disposed on the wiring substrate and electrically connected to the gate link lines, a circuit film connected to one portion of the first panel part and configured to transmit a gate control signal to the first panel part, and at least one second panel part disposed on the wiring substrate and electrically connected to the gate link lines.

According to an embodiment of the present disclosure, the GIP circuit part may be disposed in a separate panel part different from a panel part including a pixel. Thus, the decrease in a size of the transmissive area of the panel part including the pixel due to the GIP circuit part may be minimized such that a transmittance of a transparent display apparatus may be improved.

Furthermore, according to an embodiment of the present disclosure, a plurality of panel parts including a plurality of signal lines are disposed on a wiring substrate including a plurality of link lines such that a link line and a signal line are disposed so as to overlap each other. Thus, a transmittance of a transparent display apparatus may be improved.

Furthermore, according to an embodiment of the present disclosure, a GIP circuit part may be disposed in a separate panel part different from a panel part in which a pixel is included. Thus, a size of a display area of the panel part including the pixel may be relatively increased. Thus, a display apparatus having a high-efficiency and high-luminance may be realized. Thus, a display apparatus having a low power consumption may be implemented.

Furthermore, according to an embodiment of the present disclosure, the GIP circuit part is disposed in a separate panel part from the panel part in which the pixel is included. Thus, the size of the non-display area of the panel part including the pixel may be relatively reduced to minimize the bezel area of each panel part including the pixel. Thus, a tiling display apparatus in which the boundary part between the tile panel parts is substantially invisible may be realized.

Furthermore, according to an embodiment of the present disclosure, the plurality of panel parts arranged in a tiling manner may be disposed on and attached to the wiring substrate, thereby freely and easily implementing display apparatuses with large screens of various sizes and shapes.

Furthermore, according to an embodiment of the present disclosure, a separate circuit area is not disposed in the wiring substrate but only the lines are disposed in the wiring substrate. Thus, not only may the production cost of the wiring substrate be reduced, but also the process optimization may be obtained.

Other systems, methods, features and advantages will be, or will become, apparent to one with skill in the art upon examination of the following figures and detailed description. It is intended that all such additional systems, methods, features and advantages are included within this description, are within the scope of the present disclosure, and are protected by the following claims. Nothing in this section should be taken as a limitation on those claims. Further aspects and advantages are discussed below in conjunction with aspects of the disclosure.

It is to be understood that both the foregoing description and the following description of the present disclosure are exemplary and explanatory and are intended to provide further explanation of the disclosure inventive concepts as claimed.

BRIEF DESCRIPTION OF DRAWINGS

The accompanying drawings, which are included to provide a further understanding of the disclosure and are incorporated in and constitute a part of this application, illustrate embodiments of the disclosure and together with the description serve to explain principles of the disclosure.

Figure 1:
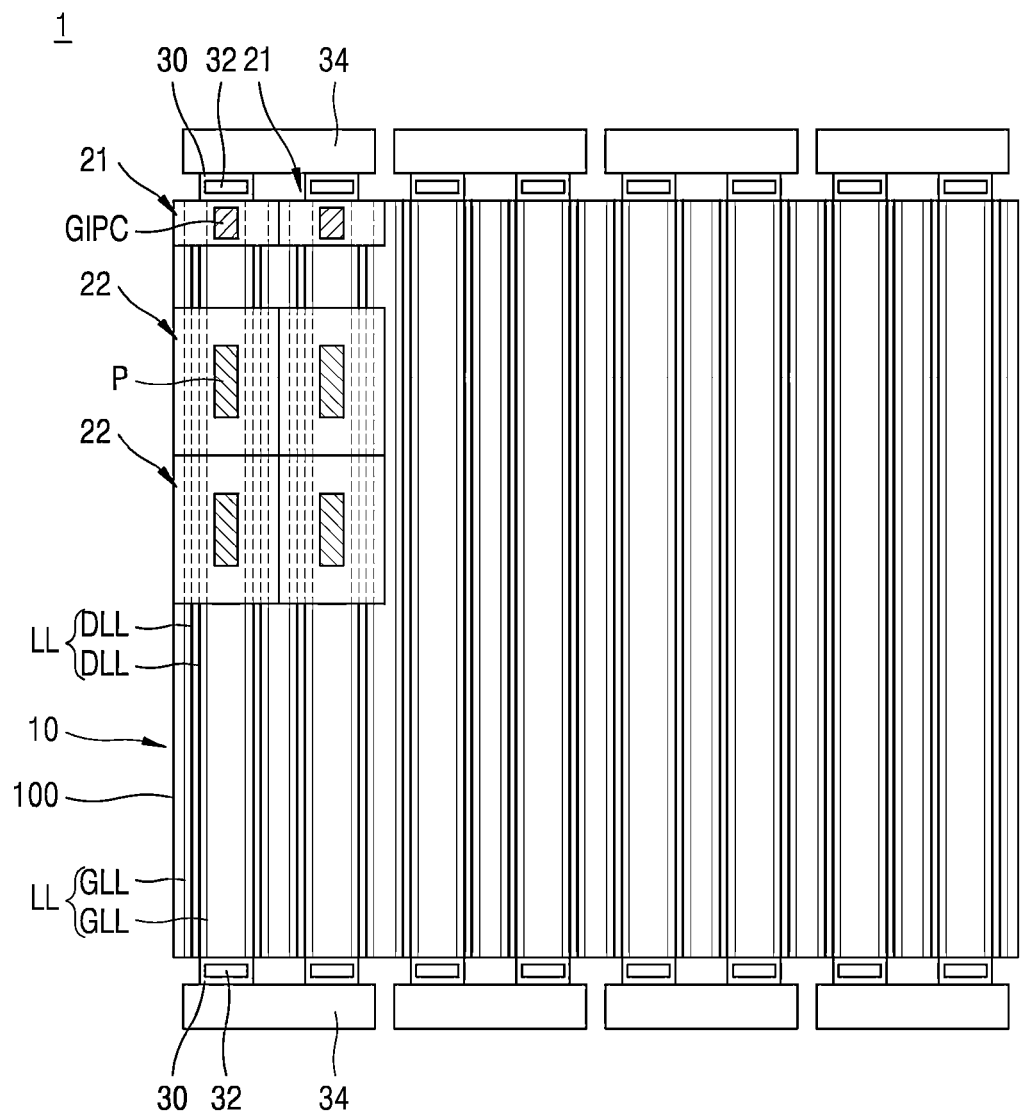
FIG. 1 is a plan view of a display apparatus according to an embodiment of the present disclosure.

Throughout the drawings and the detailed description, unless otherwise described, the same drawing reference numerals should be understood to refer to the same elements, features, and structures. The sizes, lengths, and thicknesses of layers, regions and elements, and depiction of thereof may be exaggerated for clarity, illustration, and/or convenience.

DETAILED DESCRIPTION

Reference is now made in detail to embodiments of the present disclosure, examples of which may be illustrated in the accompanying drawings. In the following description, when a detailed description of well-known functions, structures or configurations may unnecessarily obscure aspects of the present disclosure, the detailed description thereof may have been omitted for brevity. Further, repetitive descriptions can be omitted for brevity. The progression of processing steps and/or operations described is a non-limiting example.

The sequence of steps and/or operations is not limited to that set forth herein and may be changed to occur in an order that is different from an order described herein, with the exception of steps and/or operations necessarily occurring in a particular order. In one or more examples, two operations in succession may be performed substantially concurrently, or the two operations may be performed in a reverse order or in a different order depending on a function or operation involved.

Unless stated otherwise, like reference numerals may refer to like elements throughout even when they are shown in different drawings. In one or more aspects, identical elements (or elements with identical names) in different drawings may have the same or substantially the same functions and properties unless stated otherwise. Names of the respective elements used in the following explanations are selected only for convenience and may be thus different from those used in actual products.

Advantages and features of the present disclosure, and implementation methods thereof, are clarified through the embodiments described with reference to the accompanying drawings. The present disclosure may, however, be embodied in different forms and should not be construed as limited to the embodiments set forth herein. Rather, these embodiments are examples and are provided so that this disclosure may be thorough and complete, and to assist those of skill in the art to understand the inventive concepts without limiting the protected scope of the present disclosure.

Shapes (e.g., sizes, lengths, widths, heights, thicknesses, locations, radii, diameters, and areas), angles, numbers, and the like disclosed herein, including those illustrated in the drawings are merely examples, and thus, the present disclosure is not limited to the illustrated details. Any implementation described herein as an "example" is not necessarily to be construed as preferred or advantageous over other implementations. It is, however, noted that the relative dimensions of the components illustrated in the drawings are part of the present disclosure.

When the term "comprise," "have," "include," "contain," "constitute," "made up of," "formed of," or the like is used with respect to one or more elements, one or more other elements may be added unless a term such as "only" or the like is used. The terms used in the present disclosure are merely used in order to describe example embodiments, and are not intended to limit the scope of the present disclosure. The terms of a singular form may include plural forms unless the context clearly indicates otherwise.

The word "exemplary" is used to mean serving as an example or illustration. Aspects are example aspects. "Embodiments," "examples," "aspects," and the like should not be construed as preferred or advantageous over other implementations. An embodiment, an example, an example embodiment, an aspect, or the like may refer to one or more embodiments, one or more examples, one or more example embodiments, one or more aspects, or the like, unless stated otherwise.

In one or more aspects, unless explicitly stated otherwise, an element, feature, or corresponding information (e.g., a level, range, dimension, size, or the like) is construed to include an error or tolerance range even where no explicit description of such an error or tolerance range is provided. An error or tolerance range may be caused by various factors (e.g., process factors, internal or external impact, noise, or the like). In interpreting a numerical value, the value is interpreted as including an error range unless explicitly stated otherwise.

In describing a positional relationship, where the positional relationship between two parts (e.g., layers, films, regions, components, sections, or the like) is described, for example, using "on," "upon," "on top of," "over," "under," "above," "below," "beneath," "near," "close to," "adjacent to," "beside," "next to," "at or on a side of," or the like, one or more parts may be located between two other parts unless a more limiting term, such as "immediate(ly)," "direct(ly)," or "close(ly)," is used. For example, when a structure is described as being positioned "on," "on a top of," "upon," "on top of," "over," "under," "above," "below," "beneath," "near," "close to," "adjacent to," "beside," or "next to," "at or on a side of," or the like another structure, this description should be construed as including a case in which the structures contact each other as well as a case in which one or more additional structures are disposed or interposed therebetween. Furthermore, the terms "front," "rear," "back," "left," "right," "top," "bottom," "downward," "upward," "upper," "lower," "up," "down," "column," "row," "vertical," "horizontal," and the like refer to an arbitrary frame of reference.

Spatially relative terms, such as "below," "beneath," "lower," "on," "above," "upper" and the like, can be used to describe a correlation between various elements (e.g., layers, films, regions, components, sections, or the like) as shown in the drawings. The spatially relative terms are to be understood as terms including different orientations of the elements in use or in operation in addition to the orientation depicted in the drawings. For example, if the elements shown in the drawings are turned over, elements described as "below" or "beneath" other elements would be oriented "above" other elements. Thus, the term "below," which is an example term, can include all directions of "above" and "below." Likewise, an exemplary term "above" or "on" can include both directions of "above" and "below."

In describing a temporal relationship when the temporal order is described as "after," "subsequent," "next," "before," "preceding," "prior to," or the like a case which is not consecutive or not sequential may be included and thus one or more other events may occur therebetween, unless a more limiting term, such as "just," "immediate(ly)," or "direct (ly)" is used.

The terms, such as "below," "lower," "above," "upper" and the like, may be used herein to describe a relationship between element(s) as illustrated in the drawings. It will be understood that the terms are spatially relative and based on the orientation depicted in the drawings.

It is understood that, although the terms "first", "second," or the like may be used herein to describe various elements (e.g., layers, films, regions, components, sections, or the like), these elements should not be limited by these terms. These terms are used only to partition one element from another. For example, a first element could be a second element, and, similarly, a second element could be a first element, without departing from the scope of the present disclosure. Furthermore, the first element, the second element, and the like may be arbitrarily named according to the convenience of those skilled in the art without departing from the scope of the present disclosure. For clarity, the functions or structures of these elements (e.g., the first element, the second element and the like) are not limited by ordinal numbers or the names in front of the elements. Further, a first element may include one or more first elements. Similarly, a second element may include one or more second elements or the like.

In describing elements of the present disclosure, the terms "first," "second," "A," "B," "(a)," "(b)," or the like may be used. These terms are intended to identify the corresponding element(s) from the other element(s), and these are not used to define the essence, basis, order, or number of the elements.

For the expression that an element (e.g., layer, film, region, component, section, or the like) is "connected," "coupled," "attached," "adhered," or the like to another element, the element can not only be directly connected, coupled, attached, adhered, or the like to another element, but also be indirectly connected, coupled, attached, adhered, or the like to another element with one or more intervening elements disposed or interposed between the elements, unless otherwise specified.

For the expression that an element (e.g., layer, film, region, component, section, or the like) "contacts," "overlaps," or the like with another element, the element can not only directly contact, overlap, or the like with another element, but also indirectly contact, overlap, or the like with another element with one or more intervening elements disposed or interposed between the elements, unless otherwise specified.

The phrase that an element (e.g., layer, film, region, component, section, or the like) is "provided in," "disposed in," or the like in another element may be understood as that at least a portion of the element is provided in, disposed in, or the like in another element, or that the entirety of the element is provided in, disposed in, or the like in another element. The phrase that an element (e.g., layer, film, region, component, section, or the like) "contacts," "overlaps," or the like with another element may be understood as that at least a portion of the element contacts, overlaps, or the like with a least a portion of another element, or that the entirety of the element contacts, overlaps, or the like with a least a portion of another element, or that at least a portion of the element contacts, overlaps, or the like with the entirety of another element.

The terms such as a "line" or "direction" should not be interpreted only based on a geometrical relationship in which the respective lines or directions are parallel or perpendicular to each other, and may be meant as lines or directions having wider directivities within the range within which the components of the present disclosure can operate functionally. For example, the terms "first direction," "second direction," and the like, such as a direction parallel or perpendicular to "x-axis," "y-axis," or "z-axis," should not be interpreted only based on a geometrical relationship in which the respective directions are parallel or perpendicular to each other, and may be meant as directions having wider directivities within the range within which the components of the present disclosure can operate functionally.

The term "at least one" should be understood as including any and all combinations of one or more of the associated listed items. For example, each of the phrases of "at least one of a first item, a second item, or a third item" and "at least one of a first item, a second item, and a third item" may represent (i) a combination of items provided by two or more of the first item, the second item, and the third item or (ii) only one of the first item, the second item, or the third item.

The expression of a first element, a second elements "and/or" a third element should be understood as one of the first, second and third elements or as any or all combinations of the first, second and third elements. By way of example, A, B and/or C can refer to only A; only B; only C; any of A, B, and C (e.g., A, B, or C); or some combination of A, B, and C (e.g., A and B; A and C; or B and C); or all of A, B, and C. Furthermore, an expression "A/B" may be understood as A and/or B. For example, an expression "A/B" can refer to only A; only B; A or B; or A and B.

In one or more aspects, the terms "between" and "among" may be used interchangeably simply for convenience unless stated otherwise. For example, an expression "between a plurality of elements" may be understood as among a plurality of elements. In another example, an expression "among a plurality of elements" may be understood as between a plurality of elements. In one or more examples, the number of elements may be two. In one or more examples, the number of elements may be more than two. Furthermore, when an element (e.g., layer, film, region, component, sections, or the like) is referred to as being "between" at least two elements, the element may be the only element between the at least two elements, or one or more intervening elements may also be present.

In one or more aspects, the phrases "each other" and "one another" may be used interchangeably simply for convenience unless stated otherwise. For example, an expression "different from each other" may be understood as being different from one another. In another example, an expression "different from one another" may be understood as being different from each other. In one or more examples, the number of elements involved in the foregoing expression may be two. In one or more examples, the number of elements involved in the foregoing expression may be more than two.

In one or more aspects, the phrases "one or more among" and "one or more of" may be used interchangeably simply for convenience unless stated otherwise.

The term "or" means "inclusive or" rather than "exclusive or." That is, unless otherwise stated or clear from the context, the expression that "x uses a or b" means any one of natural inclusive permutations. For example, "a or b" may mean "a," "b," or "a and b." For example, "a, b or c" may mean "a," "b," "c," "a and b," "b and c," "a and c," or "a, b and c."

Features of various embodiments of the present disclosure may be partially or entirety coupled to or combined with each other, may be technically associated with each other, and may be variously inter-operated, linked or driven together. The embodiments of the present disclosure may be implemented or carried out independently of each other, or may be implemented or carried out together in a co-dependent or related relationship. In one or more aspects, the components of each apparatus according to various embodiments of the present disclosure are operatively coupled and configured.

Unless otherwise defined, all terms (including technical and scientific terms) used herein have the same meaning as commonly understood by one of ordinary skill in the art to example embodiments belong. It is further understood that terms, such as those defined in commonly used dictionaries, should be interpreted as having a meaning that is, for example, consistent with their meaning in the context of the relevant art and should not be interpreted in an idealized or overly formal sense unless expressly defined otherwise herein.

The terms used in the description below have been selected as being general and universal in the related technical field. However, there may be other terms than the terms depending on the development and/or change of technology, convention, preference of technicians, etc. Therefore, the terms used in the description below should not be understood as limiting technical ideas, but should be understood as examples of the terms for illustrating embodiments.

Further, in a specific case, a term may be arbitrarily selected by the applicant, and in this case, the detailed meaning thereof will be described in a corresponding description herein. Therefore, the terms used herein should be understood based on not only the name of the terms, but also the meaning of the terms and the content hereof.

Hereinafter, with reference to FIG. 1 to FIG. 14, a display apparatus according to an embodiment of the present disclosure will be described in detail.

Figure 2:
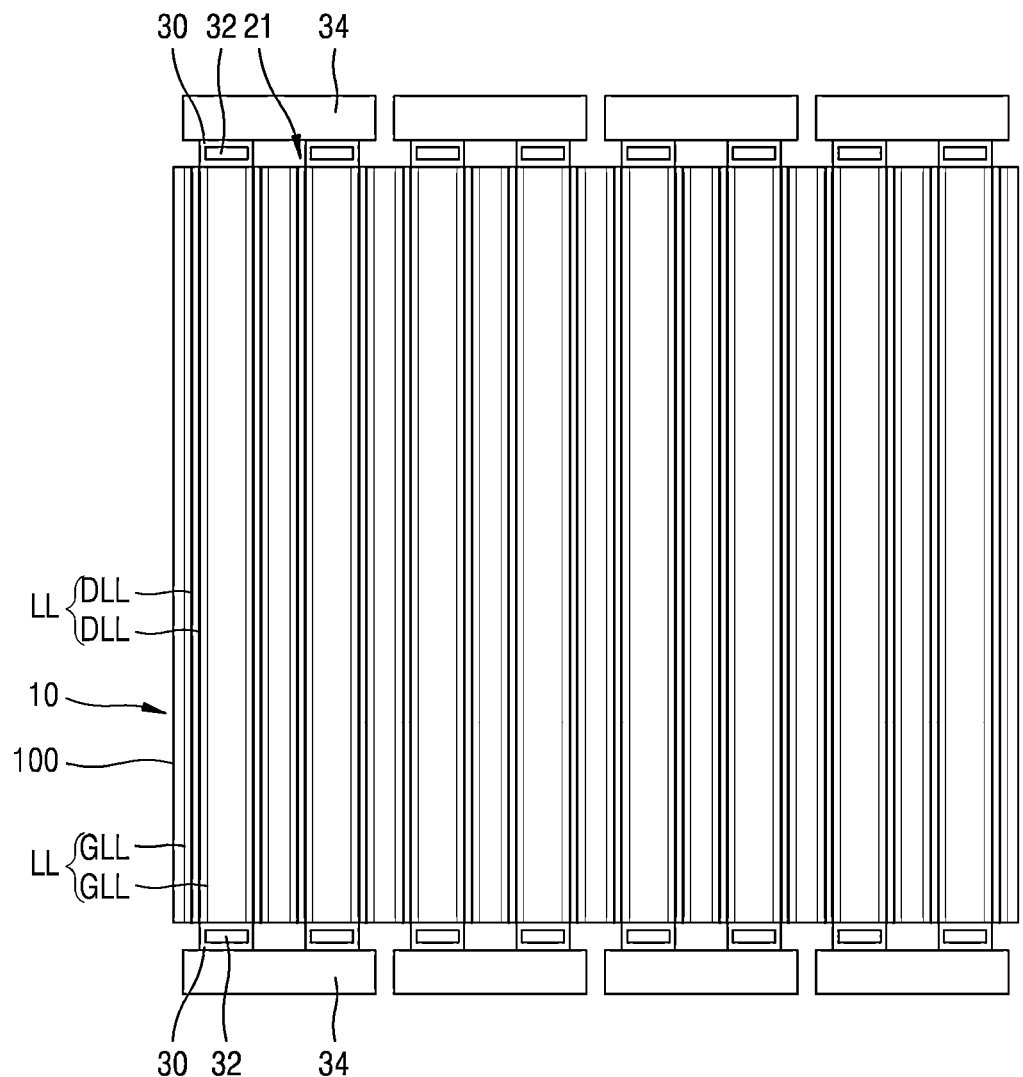
FIG. 2 is a plan view of a wiring substrate according to an embodiment of the present disclosure.
Figure 3:
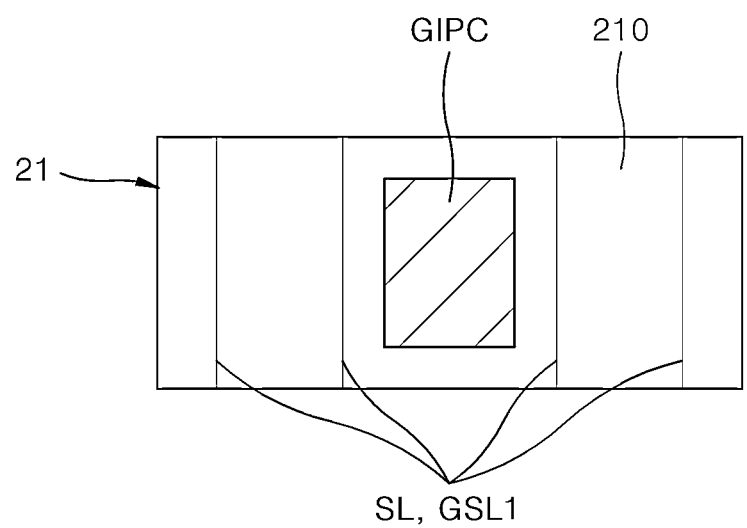
FIG. 3 and FIG. 4 are plan views of a first panel part and a second panel part, respectively, according to an embodiment of the present disclosure.
Figure 4:
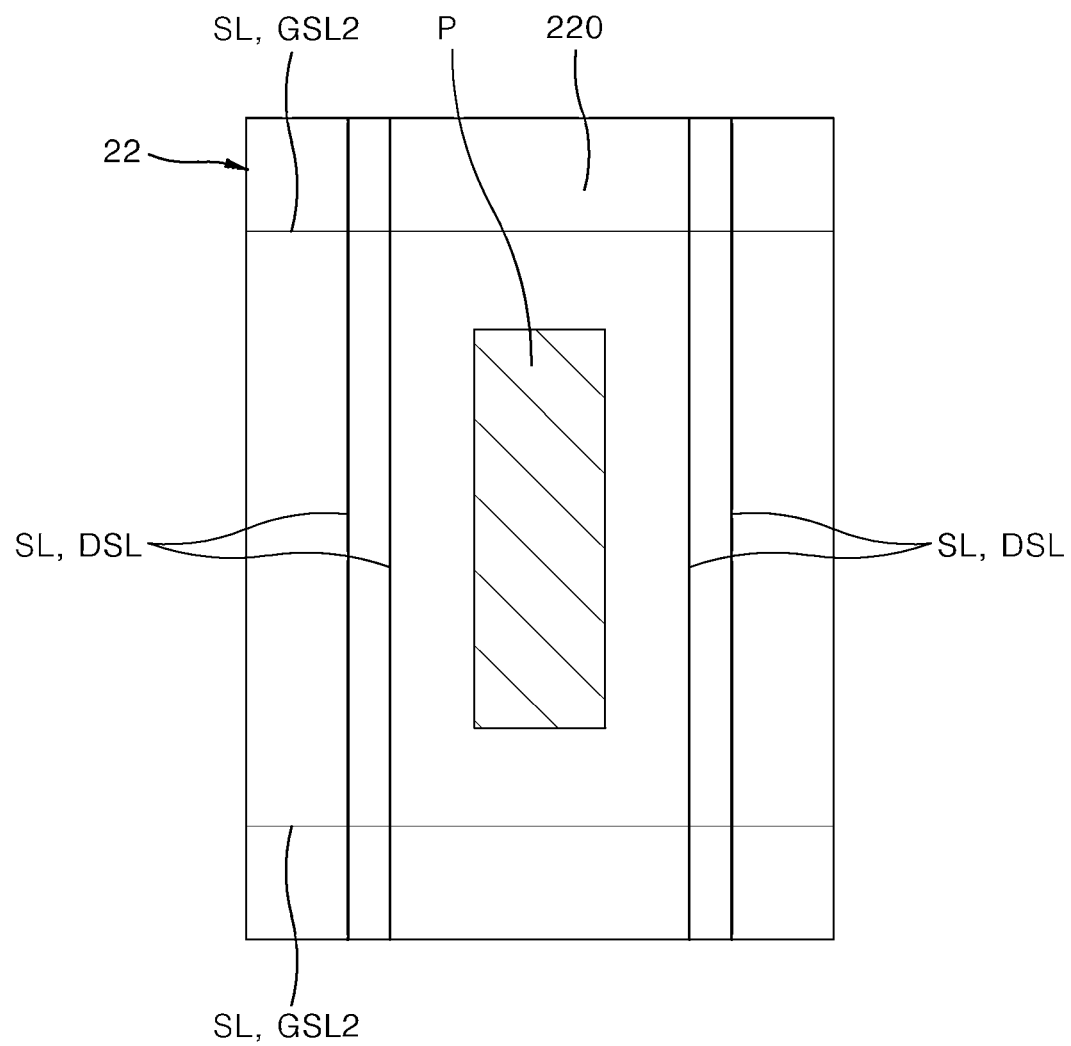

FIG. 1 is a plan view of a display apparatus 1 according to an embodiment of the present disclosure, FIG. 2 is a plan view of a wiring substrate 10, and FIG. 3 and FIG. 4 are plan views of a first panel part 21 and a second panel part 22, respectively.

Panel parts 20 including a plurality of signal lines SL may be bonded (or attached) onto the wiring substrate 10 including a plurality of link lines LL in a tiling scheme.

The panel part 20 may include the first panel part 21 and the second panel part 22.

The wiring substrate 10 may include a first substrate 100. The first substrate 100 may support the plurality of link lines LL.

The first substrate 100 may be an insulating substrate, for example, may be formed of glass or transparent plastic material to implement a transparent display apparatus.

One or more circuit films 30 may be disposed on one side (or one portion) or both sides (or both portions) of the first substrate 100 and may be electrically connected to the plurality of link lines LL.

The circuit film 30 may be a flexible circuit film, and a data driver 32 may be disposed on each circuit film 30 in a chip on film (COF) scheme. However, embodiments of the present disclosure are not limited thereto.

One or more printed circuit boards 34 may be electrically connected to the other side (or the other portion) of the circuit film 30 opposite to one side of the circuit film 30 to which the first substrate 100 is connected.

The printed circuit board 34 may be a flexible printed circuit board (FPCB).

For example, the printed circuit board 34 may include a source printed circuit board and a control printed circuit board.

In this case, the source printed circuit board and the control printed circuit board may be connected to each other by a flat flexible cable (FFC). However, embodiments of the present disclosure are not limited thereto.

A power management circuit, a timing controller, a level shifter, etc. may be disposed on the printed circuit board 34.

The power management circuit may generate various driving voltages necessary for operating all circuits of the display apparatus 1 using an input voltage supplied from an external source, and may output the generated various driving voltages to all of the circuits thereof.

The timing controller may be configured to receive image data and input timing control signals from an external host system, and generate a plurality of data control signals and a plurality of gate control signals and supply the plurality of data control signals and the image data to a data driver 32, and supply the plurality of gate control signals to a gate driver.

The data driver 32 may be configured to receive the plurality of data control signals and the image data from the timing controller, convert the image data into a data voltage signal, and supply the data voltage signal to a data signal line.

The gate driver may be configured to receive the plurality of gate control signals from the timing controller via the level shifter, convert the plurality of gate control signals into a gate signal (a scan voltage signal), and supply the gate signal (for example, a scan voltage signal) to a gate signal line.

In this case, the gate control signals applied to the gate driver may include a clock control signal (CLK), a start control signal (VST), a reset control signal (RST), etc.

The gate driver may be mounted in the first panel part 21 in a gate-in-panel (GIP) scheme.

Hereinafter, the gate driver will be referred to as a GIP circuit part GIPC.

Various voltages and signals generated in this way may be transmitted to the link lines LL of the wiring substrate 10 by the circuit film 30.

The plurality of link lines LL may be arranged and spaced apart from each other along one direction.

For example, the plurality of link lines LL may include a plurality of high-potential voltage link lines, a plurality of low-potential voltage link lines, a plurality of data link lines DLL, a plurality of reference voltage link lines, and a plurality of gate link lines GLL, etc.

The plurality of link lines LL disposed on the wiring substrate 10 may be electrically connected to the plurality of signal lines SL disposed in the panel part 20, respectively.

For example, the plurality of signal lines SL may include a plurality of high-potential voltage signal lines, a plurality of low-potential voltage signal lines, a plurality of data signal lines DSL, a plurality of reference voltage signal lines, and a plurality of gate signal lines GSL, etc.

In this way, various voltages and signals transmitted through the link line LL may be supplied to the GIP circuit part GIPC and a pixel P through the signal line SL.

The plurality of panel parts 20 including the plurality of signal lines SL may be provided in a module manner and may be bonded (or attached) onto the wiring substrate 10 in a tiling scheme, thereby implementing a tiling display apparatus.

As previously described, the plurality of panel parts 20 may include a plurality of first panel parts 21 and a plurality of second panel parts 22.

The first panel part 21 may be a GIP panel part including the GIP circuit part GIPC.

The first panel part 21 may include a first base substrate 210, and a plurality of GIP circuit parts GIPC disposed on the first base substrate 210, and a plurality of first gate signal lines GSL1 that transmit the gate control signal to the GIP circuit parts GIPC, respectively.

Furthermore, according to another embodiment of the present disclosure, in the first panel part 21, the first gate signal line GSL1 as well as a data signal line may be disposed. This will be described later.

For example, the first panel part 21 may include the GIP circuit part GIPC and the first gate signal line GSL1, and may not include components related to a pixel array, and thus may not include a display area.

The first panel part 21 may include at least one or more first panel parts.

For example, a single first panel part 21 having a large size may be formed, and then, may be disposed on one side (or one portion) of the wiring substrate 10. Alternatively, two first panel parts 21 having a large size may be formed and respectively disposed on both sides (or both portions) of the wiring substrate 10.

Furthermore, the plurality of first panel parts 21 of a relatively small size may be formed and may be arranged in a matrix form along one side (or one portion) or both sides (or both portions) of the wiring substrate 10.

In this case, the plurality of first panel parts 21 may be arranged along a row direction as a direction in which the plurality of circuit films 30 are arranged, and may be respectively adjacent to the plurality of circuit films 30 in a column direction.

The second panel part 22 may be a display panel part including a plurality of pixels P.

The second panel part 22 may include a second base substrate 220, a plurality of pixels P disposed on the second base substrate 220, and a plurality of second gate signal lines GSL2 and a plurality of data signal lines DSL which apply the gate signal and the data signal to the plurality of pixels P, respectively.

The plurality of pixels P may include a first sub-pixel SP1, a second sub-pixel SP2, and a third sub-pixel SP3.

The first sub-pixel SP1, the second sub-pixel SP2, and the third sub-pixel SP3 may emit light of different colors, respectively.

For example, the first sub-pixel SP1, the second sub-pixel SP2, and the third sub-pixel SP3 may be a red sub-pixel emitting light of red (R), a green sub-pixel emitting light of green (G), and a blue sub-pixel emitting light of blue (B). However, embodiments of the present disclosure are not limited thereto.

For example, the plurality of pixels P may further include a white sub-pixel emitting light of white (W).

Each of the plurality of sub-pixels SP1, SP2, and SP3 may include a light-emitting area and a circuit area.

Light-emitting elements may be disposed in or at the light-emitting area.

For example, the light-emitting element may be a micro-LED element. However, embodiments of the present disclosure are not limited thereto.

Furthermore, the micro-LED element may be a vertical micro-LED element or a horizontal micro-LED element, or may be a flip chip-shaped micro-LED element or a nanorod-shaped micro-LED element.

The circuit area may be an area other than the light-emitting area. A driving circuit to drive a plurality of light-emitting elements may be disposed in or at the circuit area. In one example, the driving circuit including a thin-film transistor TFT and a storage capacitor Cst may be disposed in or at the circuit area.

In one example, a light-transmissive area may be further disposed in the plurality of pixels P, so that the display apparatus 1 may be configured to be a transparent display apparatus. The second panel part 22 may include at least one or more second panel parts.

For example, a single second panel part 22 may be formed to have a large size and may be disposed on the wiring substrate 10.

Alternatively, a plurality of second panel parts 22 of a relatively small size may be formed and be disposed on the wiring substrate 10.

In this case, the plurality of second panel parts 22 may be arranged in a matrix form along a plurality of rows and a plurality of columns, and may be disposed on the wiring substrate 10 and may be connected to the wiring substrate 10.

In this way, the first panel part 21 disposed on the wiring substrate 10 may be disposed between the circuit film 30 and the second panel part 22. The first panel part 21 may first receive at least some of various signals applied from the data driver 32 or the printed circuit board 34 connected to the circuit film 30.

At least some of the various signals applied to the first panel part 21 may be transmitted to the second panel part 22 via the plurality of link lines LL disposed in the wiring substrate 10.

In this way, in the display apparatus 1 according to an embodiment of the present disclosure, the GIP circuit part GIPC may be disposed in the first panel part 21 separate from the second panel part 22 including the plurality of pixels P.

When the GIP circuit part GIPC is disposed in the first panel part 21, the GIP circuit part GIPC may reduce a reduction of a size of the transmissive area in the display panel part. Thus, a transparent display apparatus with improved transmittance may be realized.

Furthermore, in the display apparatus 1 according to an embodiment of the present disclosure, the first panel part 21 including the plurality of signal lines SL and the second panel part 22 including the plurality of signal lines SL may be connected to the wiring substrate 10 including the plurality of link lines LL.

Accordingly, the link lines LL and the signal lines SL may be disposed so as to overlap each other, respectively. Decrease in a size of the transmissive area due to the link line LL and the signal line SL may be reduced. Thus, a transparent display apparatus with improved transmittance may be realized.

Furthermore, in the display apparatus 1 according to an embodiment of the present disclosure, the GIP circuit part GIPC may be disposed in the first panel part 21 that is separate from the second panel part 22 including the plurality of pixels P. Thus, a size of the display area of the second panel part 22 as the display panel part may be relatively increased.

Accordingly, the display apparatus 1 according to an embodiment of the present disclosure may have an increased size of the display area. Thus, a high-efficiency and high-luminance display apparatus may be realized. Thus, a display apparatus having a low-power consumption may be implemented.

Furthermore, in the display apparatus 1 according to an embodiment of the present disclosure, the GIP circuit part GIPC may be disposed in the first panel part 21 that is separate from the second panel part 22 including the plurality of pixels P. Thus, a size of a non-display area in the second panel part 22 as the display panel unit may be relatively reduced.

Accordingly, in the display apparatus 1 according to an embodiment of the present disclosure, the second panel part 22 as the display panel part may be minimized a bezel area. Thus, a tiling display apparatus in which a boundary part between the second panel parts 22 is substantially invisible may be realized.

Furthermore, the display apparatus 1 according to an embodiment of the present disclosure may be implemented such that a distance (or a spacing or an interval) between the outermost light-emitting element of one second panel part 22 and the outermost light-emitting element of another second panel part 22 adjacent thereto is equal to a distance (or a spacing or an interval) between light-emitting elements in one second panel part 22.

Accordingly, the display apparatus 1 according to an embodiment of the present disclosure may be minimized a non-display area, and furthermore, may be embodied as a zero-bezel tiling display apparatus substantially without bezel area.

Furthermore, in the display apparatus 1 according to an embodiment of the present disclosure, the additional circuit area or the additional light-emitting element is not disposed in the wiring substrate 10 in which only link lines LL are disposed. Thus, the wiring substrate 10 may be formed without a complicated process that requires relatively larger time and higher cost.

Accordingly, in the display apparatus 1 according to an embodiment of the present disclosure, the production cost and production time of the wiring substrate 10 may be reduced, and the process optimization may be achieved.

Furthermore, in the display apparatus 1 according to an embodiment of the present disclosure, the plurality of first panel parts 21 and the plurality of second panel parts 22 may be attached onto the wiring substrate 10 in a tiling manner. Thus, the display apparatuses 1 with screens of various sizes and shapes may be freely implemented by changing the number and arrangement of the first panel parts 21 and the second panel parts 22 that are combined with each other in the tiling manner.

In particular, because the number of the first panel parts 21 and the number of the second panel parts 22 may be freely increased, thereby more easily implementing a large-sized screen.

Furthermore, in the display apparatus 1 according to an embodiment of the present disclosure, the plurality of first panel parts 21 and the plurality of second panel parts 22 may be disposed on and bonded (or attached) to the wiring substrate 10 and may be arranged in the tiling manner. Thus, the first panel parts 21 and the second panel parts 22 may be freely and individually attached and detached from the wiring substrate 10.

Accordingly, in the display apparatus 1 according to one embodiment of the present disclosure, when a defect occurs in a specific first panel part 21 and/or a specific second panel part 22, only the defective first panel part 21 and/or the defective second panel part 22 may be removed from the wiring substrate 10 and may be replaced with a normal first panel part and/or a normal second panel part. Thus, an easier and faster repair process may be carried out.

Furthermore, in the display apparatus 1 according to an embodiment of the present disclosure, the plurality of link lines LL disposed in the wiring substrate 10 may function as an auxiliary line for the signal line SL disposed in the first panel part 21 and the second panel part 22.

The plurality of link lines LL may be arranged in parallel with each other so as to respectively overlap the plurality of signal lines SL arranged in each of the first panel part 21 and the second panel part 22 in a vertical direction (or up and down direction) and may be respectively electrically connected to the plurality of signal lines SL arranged in the first panel part 21 and the second panel part 22 by contact members 300.

Therefore, in the display apparatus 1 according to one embodiment of the present disclosure, an electrical resistance of each of the plurality of signal lines SL may be lowered. Thus, signal delay such as RC delay and luminance uniformity degradation due to voltage drop may be reduced. Thus, the display apparatus 1 may be embodied as a display apparatus having a low-power consumption and high-luminance.

Hereinafter, with reference to FIG. 5 to FIG. 9, a connection relationship of the display apparatus 1 according to one embodiment of the present disclosure will be described in more detail.

The plurality of gate link lines GLL may be disposed in the wiring substrate 10.

The plurality of gate link lines GLL may include a plurality of first gate link lines GLL1 and a plurality of second gate link lines GLL2.

The first gate link line GLL1 and the second gate link line GLL2 may be respectively formed as separate link lines LL that are physically separated from each other.

However, the first gate link line GLL1 and the second gate link line GLL2 may be electrically connected to each other by the first panel part 21.

Therefore, one side (or one portion) of the first panel part 21 may be electrically connected to the first gate link line GLL1, and the other side (or the other portion) of the first panel part 21 may be electrically connected to the second gate link line GLL2.

In accordance with the present disclosure, the first gate link line GLL1 may be referred to as a GIP gate link line (or a gate link line for a GIP), while the second gate link line GLL2 may be referred to as a pixel gate link line (or a gate link line for a pixel).

The circuit film 30 disposed on one side (or one portion) of the wiring substrate 10 may be electrically connected to one portion of each of the plurality of first gate link lines GLL1 and may transmit a gate control signal to the plurality of first gate link lines GLL1.

The first gate link line GLL1 receiving the gate control signal from the circuit film 30 may be electrically connected to one portion of the first panel part 21 and may transmit the gate control signal to the first panel part 21.

The first panel part 21 may include the plurality of GIP circuit parts GIPC, and the first gate signal line GSL1 that transmits the gate control signal to the plurality of GIP circuit parts GIPC.

The first gate signal line GSL1 may include a first gate signal input line GSIL1 and a first gate signal output line GSOL1.

One side (or one portion) of the first gate signal input line GSIL1 may be electrically connected to the first gate link line GLL1 and the other side (or the other portion) may be electrically connected to the GIP circuit part GIPC.

The plurality of first gate signal input lines GSIL1 may include a plurality of clock signal input lines GSIL11, a start signal input line GSIL12, and a reset signal input line GSIL13.

The clock signal input line GSIL11 may be electrically connected to each of the GIP circuit part GIPC and may apply a clock signal CLK thereto.

The start signal input line GSIL12 may be electrically connected to the GIP circuit part GIPC disposed at one end and apply a start signal VST thereto. The reset signal input line GSIL13 may be electrically connected to the GIP circuit part GIPC disposed at the other end and may apply a reset signal RST thereto.

One side (or one portion) of the first gate signal output line GSOL1 may be electrically connected to the GIP circuit part GIPC, and the other side (or the other portion) may be electrically connected to the second gate link line GLL2.

The GIP circuit part GIPC receiving the gate control signal via the first gate signal input line GSIL1 may convert the gate control signal into the gate signal and sequentially output the gate signal.

In this way, the gate signal sequentially output from the GIP circuit part GIPC may be transmitted to the second gate link line GLL2 of the wiring substrate 10 via (or by) the first gate signal output line GSOL1.

The second gate link line GLL2 may be electrically connected to one side (or one portion) of the second panel part 22 and may transmit the gate signal to the second panel part 22.

The second panel part 22 may include a plurality of pixels P, and a plurality of second gate signal lines GSL2 that transmit a gate signal transmitted from the second gate link line GLL2 to the plurality of pixels P, respectively.

Furthermore, the second panel part 22 may include a plurality of data signal lines DSL that transmit a data signal to the plurality of pixels P, respectively.

The plurality of data signal lines DSL may extend in the first direction or a column direction, and may be arranged in the second direction or a row direction. The plurality of second gate signal lines GSL2 may extend in the second direction, and may be arranged in the first direction or the column direction. The plurality of pixels P may be respectively disposed at areas where the plurality of data signal lines DSL and the plurality of second gate signal lines GSL2 intersect each other.

In this case, each of the plurality of pixels P may correspond to each sub-pixel.

In this way, the gate control signal transmitted from the circuit film 30 may be applied to the GIP circuit part GIPC by the first gate link line GLL1 disposed in the wiring substrate 10 and the first gate signal input line disposed in the first panel part 21.

Then, the gate signal output sequentially from the GIP circuit part GIPC may be applied to each pixel P by the first gate signal output line, the second gate link line GLL2 disposed in the wiring substrate 10, and the second gate signal line GSL2 disposed in the second panel part 22.

Therefore, each of the lines transmitting the gate control signal and the lines transmitting the gate signal may be electrically connected to each other by a contact member 300.

The contact member 300 may be formed of a conductive material.

For example, the contact member 300 may be formed of a metal, conductive ink, or conductive paste such as silver paste. However, embodiments of the present disclosure are not limited thereto.

For example, the contact member 300 may be disposed between the first gate link line GLL1 and the first gate signal input line GSIL1, the contact member 300 may be disposed between the first gate signal output line GSOL1 and the second gate link line GLL2, and the contact member 300 may be disposed between the second gate link line GLL2 and the second gate signal line GSL2.

In this case, a first gate input link contact part GILC1 may be formed on or at the first gate link line GLL1. A first gate input signal contact part GISC1 may be formed on or at the first gate signal input line GSIL1. The first gate input link contact part GILC1 and the first gate input signal contact part GISC1 may be electrically connected to each other by the contact member 300.

Furthermore, a first gate output signal contact part GOSC1 may be formed in or at the first gate signal output line GSOL1, and a second gate output link contact part GOLC2 may be formed on or at the second gate link line GLL2. Thus, the first gate output signal contact part GOSC1 and the second gate output link contact part GOLC2 may be electrically connected to each other by the contact member 300.

Furthermore, a second gate input link contact part GILC2 may be formed on or at the second gate link line GLL2, and a second gate input signal contact part GISC2 may be formed on or at the second gate signal line GSL2. The second gate input link contact part GILC2 and the second gate input signal contact part GISC2 may be electrically connected to each other by the contact member 300.

Figure 5:
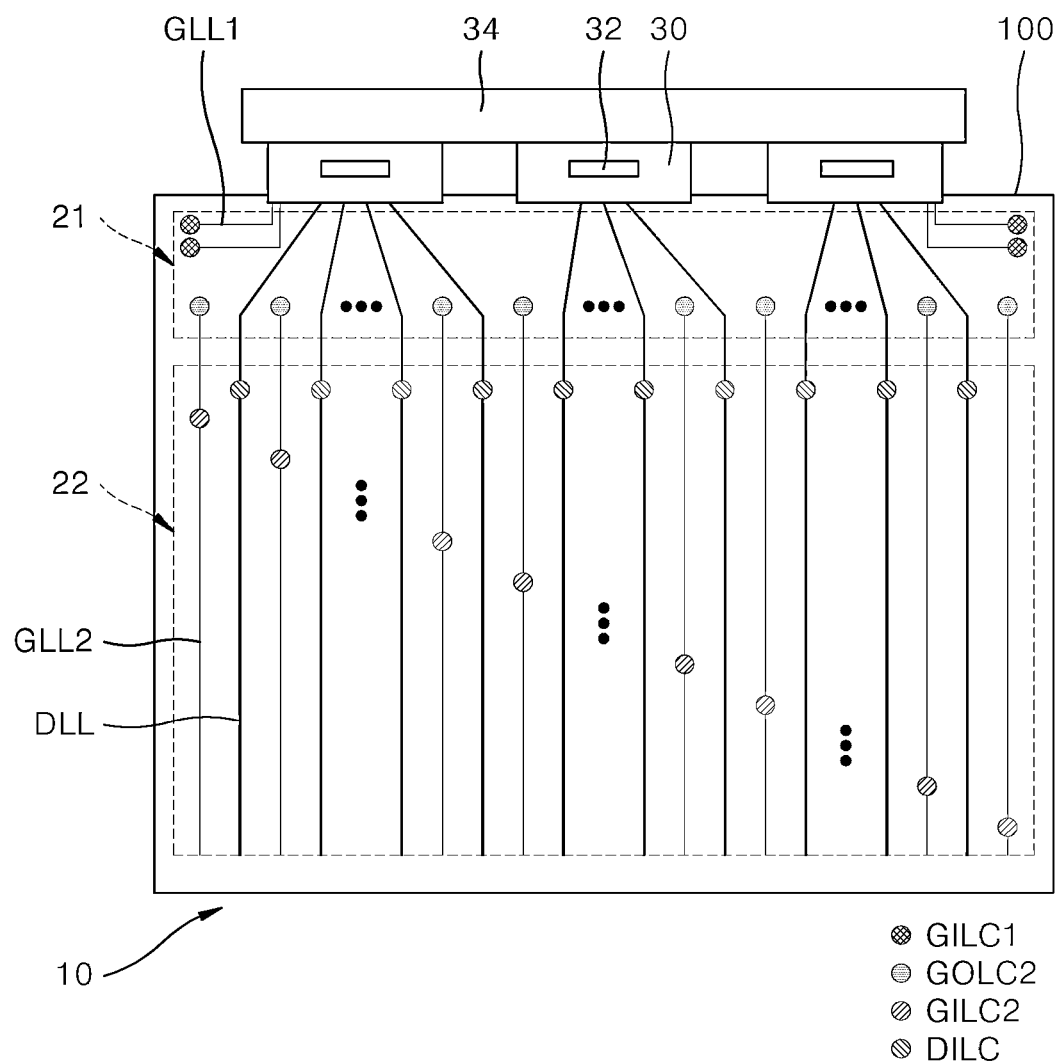
FIG. 5 is an enlarged plan view of a partial area of a wiring substrate corresponding to an area where one first panel part and one second panel part are disposed, according to an embodiment of the present disclosure.
Figure 6:
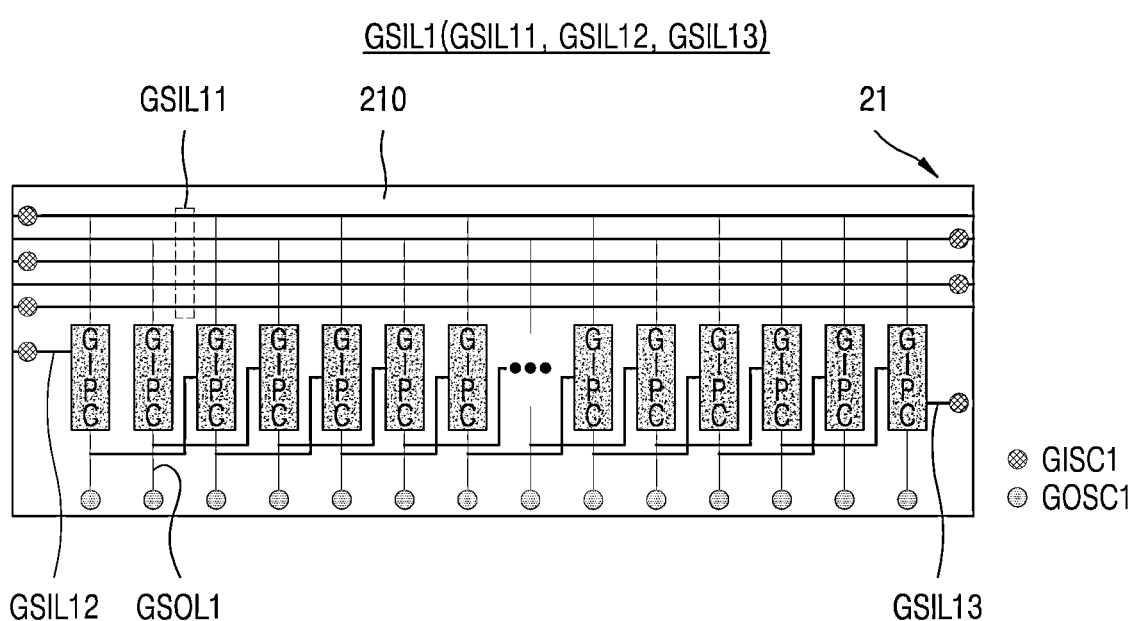
FIG. 6 and FIG. 7 are enlarged plan views of one first panel part and one second panel part, respectively, according to an embodiment of the present disclosure.
Figure 7:
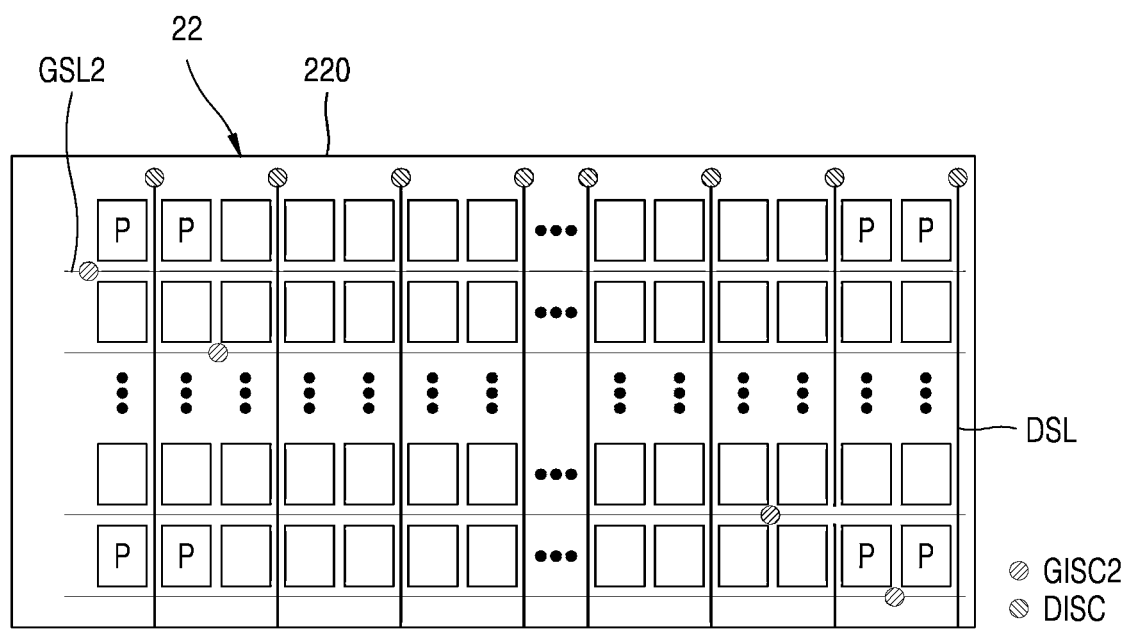
Figure 8:
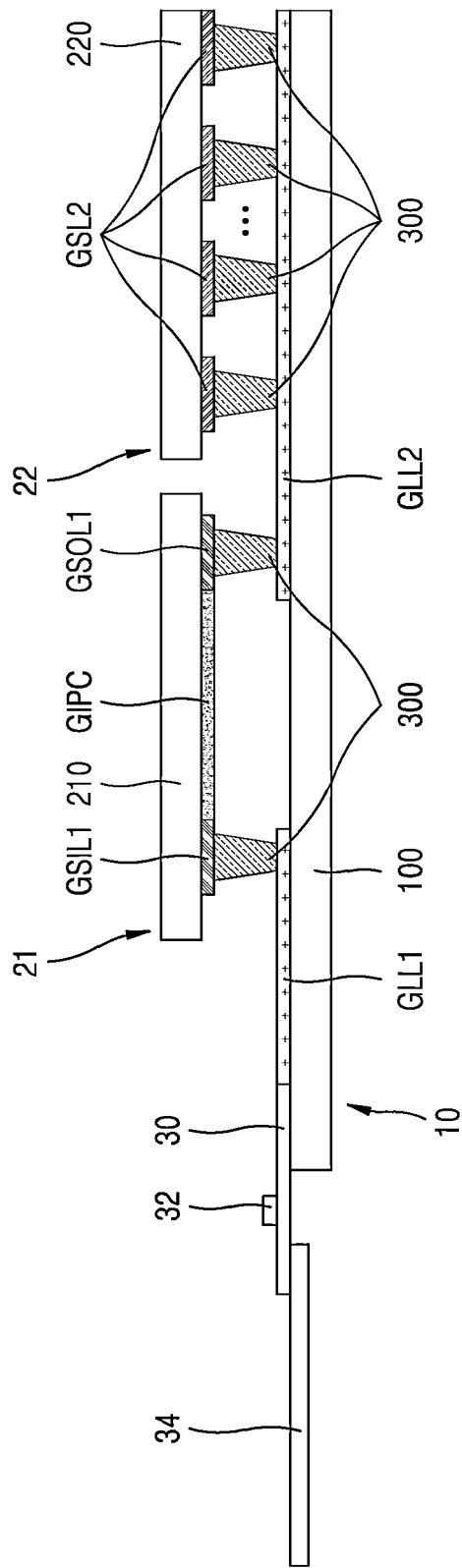
FIG. 8 is a cross-sectional view showing lines transmitting a gate signal in a state in which a first panel part and a second panel part are disposed on and attached to a wiring substrate, according to an embodiment of the present disclosure.

In FIG. 5 and FIG. 7, the second gate input link contact part GILC2 and the second gate input signal contact part GISC2 are shown as being arranged sequentially. However, embodiments of the present disclosure are not limited thereto, and the second gate input link contact parts GILC2 and the second gate input signal contact parts GISC2 may be arranged randomly for image quality.

Therefore, each of the contact parts formed on or at the link lines LL and the contact parts formed on or at the signal lines SL may be a partial area of each of the link lines LL and the signal lines SL. However, embodiments of the present disclosure are not limited thereto. Each of the contact parts formed on or at the link lines LL and the contact parts formed on or at signal line SL may be a separate connection electrode electrically connected to each of the link lines LL and the signal lines SL.

Furthermore, the number of gate-related signal lines and the number of data-related signal lines may be adjusted depending on a resolution of the display apparatus 1. Thus, the number of the contact parts formed on or at the lines may change correspondingly.

The plurality of data link lines DLLs may be disposed in the wiring substrate 10.

The circuit film 30 disposed on one side (or one portion) of the wiring substrate 10 may be electrically connected to one side (or one portion) of each of the plurality of data link lines DLL and may transmit the data signal to the plurality of data link lines DLL.

The data link line DLL receiving the data signal from the circuit film 30 may be electrically connected to one side (or one portion) of the second panel part 22 and may transmit the data signal to the second panel part 22.

The second panel part 22 may include the plurality of pixels P, and the plurality of second gate signal lines GSL2 that transmit the gate signal to the plurality of pixels P, respectively.

Furthermore, the second panel part 22 may include the plurality of data signal lines DSL that transmit the data signal to the plurality of pixels P, respectively.

Thus, the data signal transmitted from the circuit film 30 may be applied to each pixel P by the data link line DLL disposed in or at the wiring substrate 10 and the data signal line DSL disposed in or at the second panel part 22.

The lines transmitting the data signal may be electrically connected to each other by the contact member 300.

For example, the contact member 300 may be disposed between the data link line DLL and the data signal line DSL.

In this case, a data input link contact part DILC may be formed on or at the data link line DLL, and the data input signal contact part DISC may be formed on or at the data signal line DSL. The data input link contact DILC and the data input signal contact DISC may be electrically connected to each other by the contact member 300.

As described above, each of the contact parts formed on or at the link lines LL and the contact parts formed on or at the signal lines SL may be a partial area of each of the link lines LL and the signal lines SL. However, embodiments of the present disclosure are not limited thereto. Each of the contact parts formed on or at the link lines LL and the contact parts formed on or at signal line SL may be a separate connection electrode electrically connected to each of the link lines LL and the signal lines SL.

In addition, the first panel part 21 and the second panel part 22 disposed on the wiring substrate 10 may be bonded (or attached) to the wiring substrate 10 by an optical resin layer.

Furthermore, the optical resin layer may also serve as a filler filling a space between the wiring substrate 10 and the first panel part 21 and the second panel part 22 and a space between the first panel part 21 and the second panel part 22.

For example, the optical resin layer may include optical clear resin (OCR), but is not limited thereto.

Hereinafter, with referring to FIG. 10 to FIG. 13, a connection relationship of the display apparatus 1 according to another embodiment of the present disclosure will be described in more detail.

The plurality of gate link lines GLL may be disposed in the wiring substrate 10.

The plurality of first panel parts 21 may be disposed on the wiring substrate 10, and one end (or one portion or one side) of the plurality of gate link lines GLL may be electrically connected to each of the plurality of first panel parts 21.

The circuit film 30 may be connected to one side (or one portion) of the first panel part 21, and may apply the gate control signal directly to the first panel part 21.

For example, the circuit film 30 is not connected to the wiring substrate 10, but is directly connected to the first panel part 21. Thus, the gate control signal may be applied directly to the first panel part 21 without passing through the wiring substrate 10.

The first panel part 21 may include the plurality of GIP circuit parts GIPC, and the first gate signal lines GSL1 that transmit the gate control signal to the plurality of GIP circuit parts GIPC.

The first gate signal line GSL1 may include the first gate signal input line GSIL1 and the first gate signal output line GSOL1.

One side (or one portion) of the first gate signal input line GSIL1 may be electrically connected to the circuit film 30 and the other side (or the other portion) may be electrically connected to the GIP circuit part GIPC.

The plurality of first gate signal input lines GSIL1 may include the plurality of clock signal input lines GSIL11, the start signal input line GSIL12, and the reset signal input line GSIL13.

The clock signal input line GSIL11 may be electrically connected to each GIP circuit part GIPC and may apply the clock signal CLK thereto.

The start signal input line GSIL12 may be electrically connected to the GIP circuit part GIPC disposed at one end and may apply the start signal VST thereto. The reset signal input line GSIL13 may be electrically connected to the GIP circuit part GIPC disposed at the other end and may apply the reset signal RST thereto.

One side (or one portion) of the first gate signal output line GSOL1 may be electrically connected to the GIP circuit GIPC, and the other side (or the other portion) may be electrically connected to the gate link line GLL.

The GIP circuit part GIPC receiving the gate control signal via the first gate signal input line GSIL1 may convert the gate control signal into the gate signal and sequentially output the gate signal.

Thus, the gate signal sequentially output from the GIP circuit part GIPC may be transmitted to the gate link line GLL of the wiring substrate 10 by the first gate signal output line GSOL1.

The gate link line GLL may be electrically connected to one side (or one portion) of the second panel unit 22 and may transmit the gate signal to the second panel part 22.

The second panel part 22 may include the plurality of pixels P, and the plurality of second gate signal line GSL2 that transmit the gate signal transmitted from the gate link line GLL to the plurality of pixels P, respectively.

Furthermore, the second panel part 22 may include the plurality of data signal lines DSL that transmit the data signal to the plurality of pixels P, respectively.

The plurality of data signal lines DSL may extend in the first direction or a column direction, and may be arranged in the second direction or a row direction. The plurality of second gate signal lines GSL2 may extend in the second direction, and may be arranged in the first direction or the column direction. The plurality of pixels P may be respectively disposed at areas where the plurality of data signal lines DSL and the plurality of second gate signal lines GSL2 intersect each other.

In this case, each of the plurality of pixels P may correspond to each sub-pixel.

Thus, the gate control signal transmitted from the circuit film 30 may be applied to the GIP circuit part GIPC via the first gate signal input line disposed in the first panel part 21.

Then, the gate signal output sequentially from the GIP circuit part GIPC may be applied to each pixel P via the first gate signal output line GSOL1, the gate link line GLL disposed in the wiring substrate 10, and the second gate signal line GSL2 disposed in the second panel part 22.

Therefore, each of the lines transmitting the gate control signal and the lines transmitting the gate signal may be electrically connected to each other by a contact member 300.

For example, the contact member 300 may be disposed between the first gate signal output line GSOL1 and the gate link line GLL. The contact member 300 may be disposed between the gate link line GLL and the second gate signal line GSL2.

Furthermore, the first gate output signal contact part GOSC1 may be formed on or at the first gate signal output line GSOL1, and the gate output link contact part GOLC may be formed on or at the gate link line GLL. The first gate output signal contact part GOSC1 and the gate output link contact part GOLC may be electrically connected to each other by the contact member 300.

Furthermore, the gate input link contact part GILC may be formed on or at the gate link line GLL, and the second gate input signal contact part GISC2 may be formed on or at the second gate signal line GSL2. The gate input link contact part GILC and the second gate input signal contact part GISC2 may be electrically connected to each other by the contact member 300.

Figure 10:
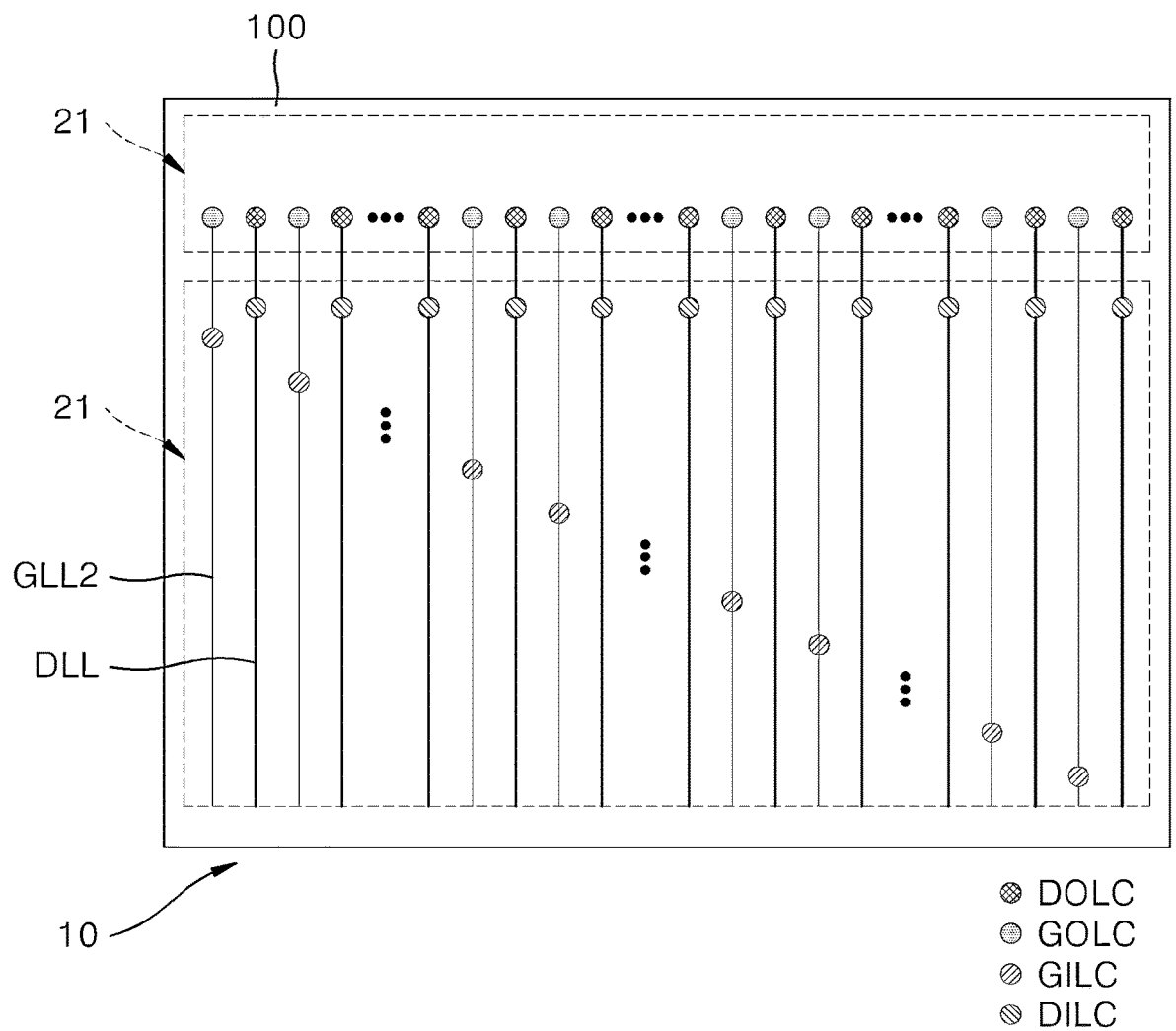
FIG. 10 is a plan view enlarging a partial area of a wiring substrate corresponding to an area where one first panel part and one second panel part are disposed, according to another embodiment of the present disclosure.
Figure 11:
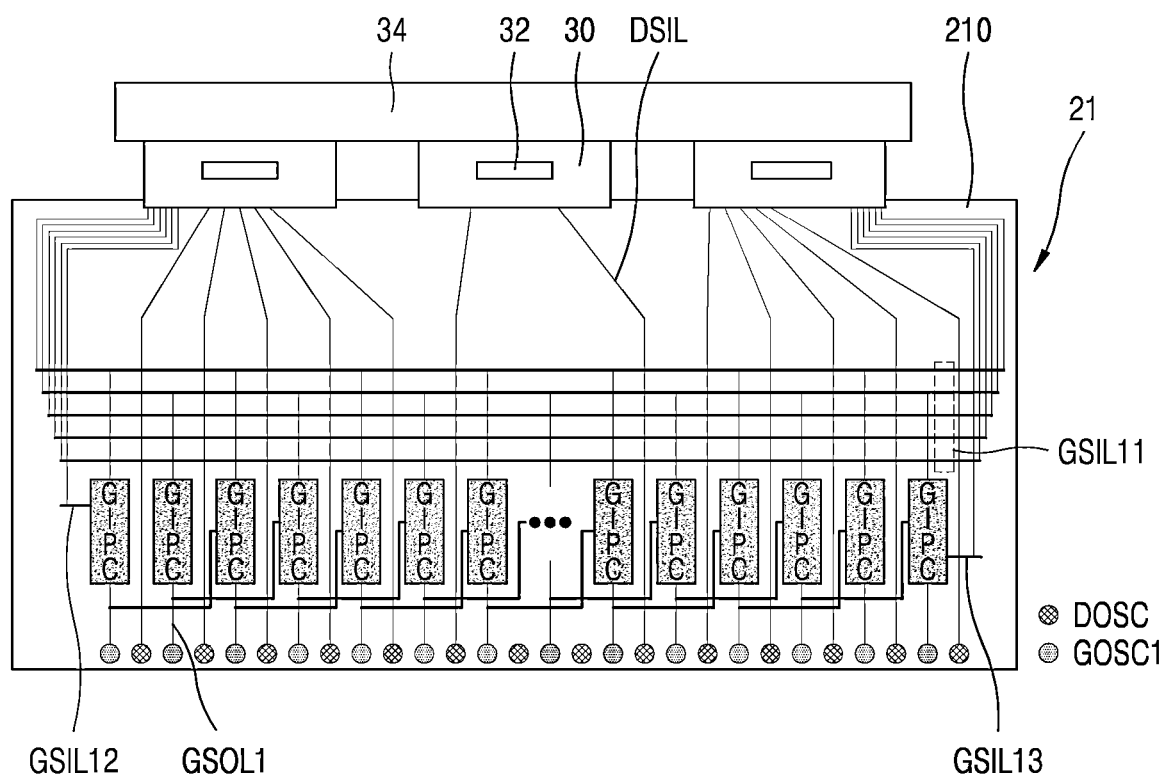
FIG. 11 and FIG. 12 are enlarged plan views of one first panel part and one second panel part, respectively, according to another embodiment of the present disclosure.
Figure 12:
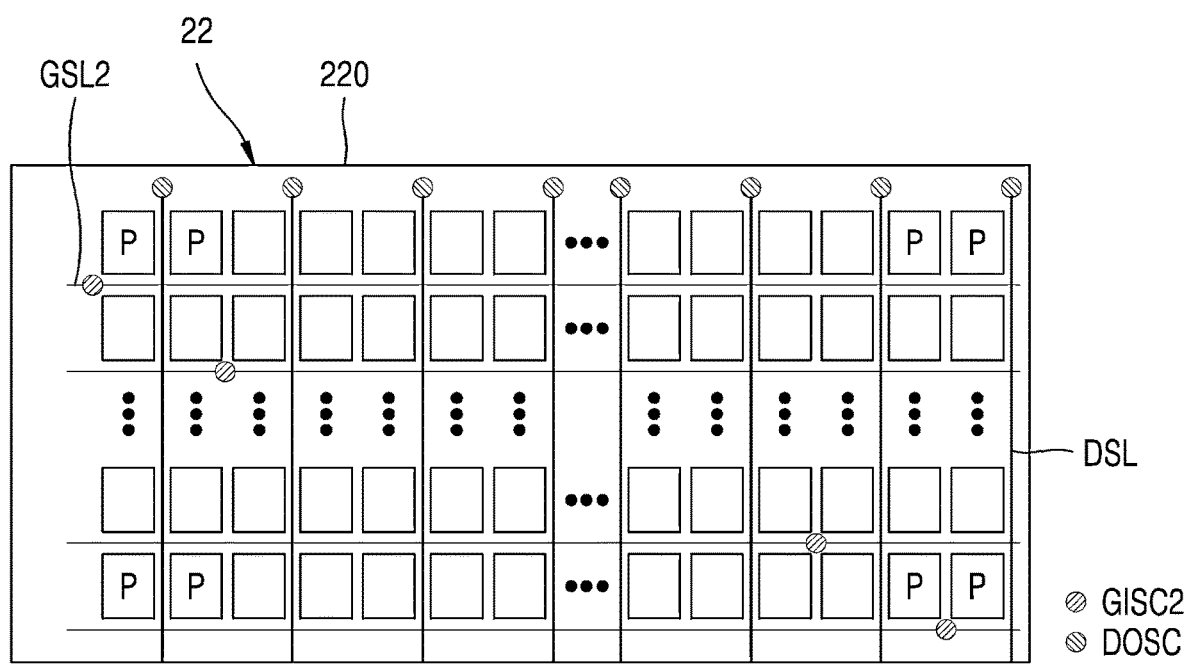
Figure 13:
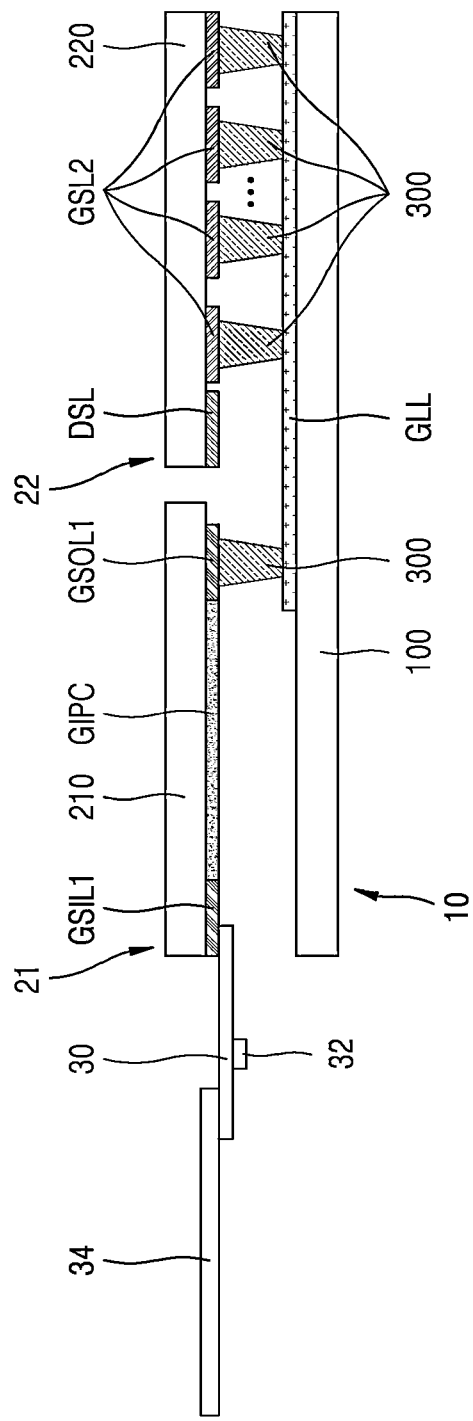
FIG. 13 is a cross-sectional view showing lines transmitting a gate signal in a state in which a first panel part and a second panel part are disposed on and attached to a wiring substrate, according to another embodiment of the present disclosure.
Figure 14:
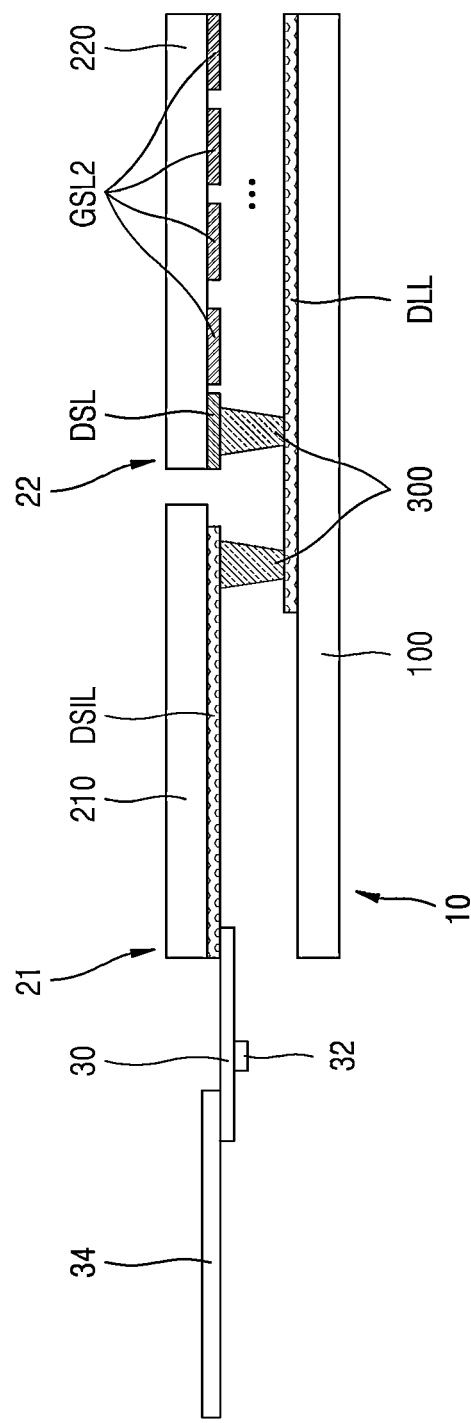
FIG. 14 is a cross-sectional view showing lines transmitting a data signal when a first panel part and a second panel part are disposed on and attached to a wiring substrate, according to another embodiment of the present disclosure.

In FIG. 10 and FIG. 12, the gate input link contact part GILC and the second gate input signal contact part GISC2 are shown as being arranged sequentially. However, embodiments of the present disclosure are not limited thereto, and the gate input link contact parts GILC and the second gate input signal contact parts GISC2 may be arranged randomly for image quality.

As described above, each of the contact parts formed on or at the link lines LL and the contact parts formed on the signal lines SL may be a partial area of each of the link lines LL and the signal lines SL. However, embodiments the present disclosure are not limited thereto. Each of the contact parts formed on the link lines LL and the contact parts formed on or at the signal line SL may be a separate connection electrode electrically connected to each of the link lines LL and the signal lines SL.

Furthermore, the number of gate-related signal lines and the number of data-related signal lines may be adjusted based on a resolution of the display apparatus 1. Thus, the number of the contact parts formed on the lines may change correspondingly.

The plurality of data link lines DLL may be disposed in the wiring substrate 10.

The circuit film 30 may connected to one side (or one portion) of the first panel part 21, and may apply the data signal directly to the first panel part 21.

For example, because the circuit film 30 is not connected to the wiring substrate 10, but is directly connected to the first panel part 21. Thus, the data signal applied from the circuit film 30 to the first panel part 21 may be applied to the wiring substrate 10 by the first panel part 21.

The circuit film 30 disposed on one side (or one portion) of the first panel part 21 may be electrically connected to one side (or one portion) of each of a plurality of data signal input lines DSIL disposed in the first panel part 21, and may apply the data signal to each of the plurality of data signal input lines DSIL.

The other side (or the other portion) of the data signal input line DSIL receiving the data signal from the circuit film 30 may be electrically connected to the data link line DLL disposed in the wiring substrate 10 and may transmit the data signal to the data link line DLL.

The data link line DLL may be electrically connected to one side (or one portion) of the second panel part 22 and may transmit the data signal to the second panel part 22.

The second panel part 22 may include the plurality of data signal lines DSL that transmit the data signal transmitted from the data link line DLL to the plurality of pixels P, respectively.

Thus, the data signal transmitted from the circuit film 30 may be applied to each pixel P via the data signal input line DSIL disposed in the first panel part 21, the data link line DLL disposed in the wiring substrate 10, and the data signal line DSL disposed in the second panel part 22.

The lines transmitting the data signal may be electrically connected to each other by the contact member 300.

For example, the contact member 300 may be disposed between the data signal input line DSIL and the data link line DLL. The contact member 300 may be disposed between the data link line DLL and the data signal line DSL.

In this case, a data output signal contact part DOSC may be formed on or at the data signal input line DSIL, and a data output link contact part DOLC may be formed on or at the data link line DLL. The former and the latter may be electrically connected to each other by the contact member 300.

Furthermore, a data input link contact part DILC may be formed on or at the data link line DLL, and a data input signal contact part DISC may be formed on or at the data signal line DSL. The data input link contact part DILC and the data input signal contact part DISC may be electrically connected to each other by the contact member 300.

As described above, the contact parts formed on or at each of the link lines LL and the contact parts formed on or at each of the signal lines SL may be a partial area of each of the link lines LL and the signal lines SL. However, the present disclosure is not limited thereto. Each of the contact parts formed on or at each of the link lines LL and the contact parts formed on or at each of the signal line SL may be a separate connection electrode electrically connected to each of the link lines LL and the signal lines SL.

Figure 15:
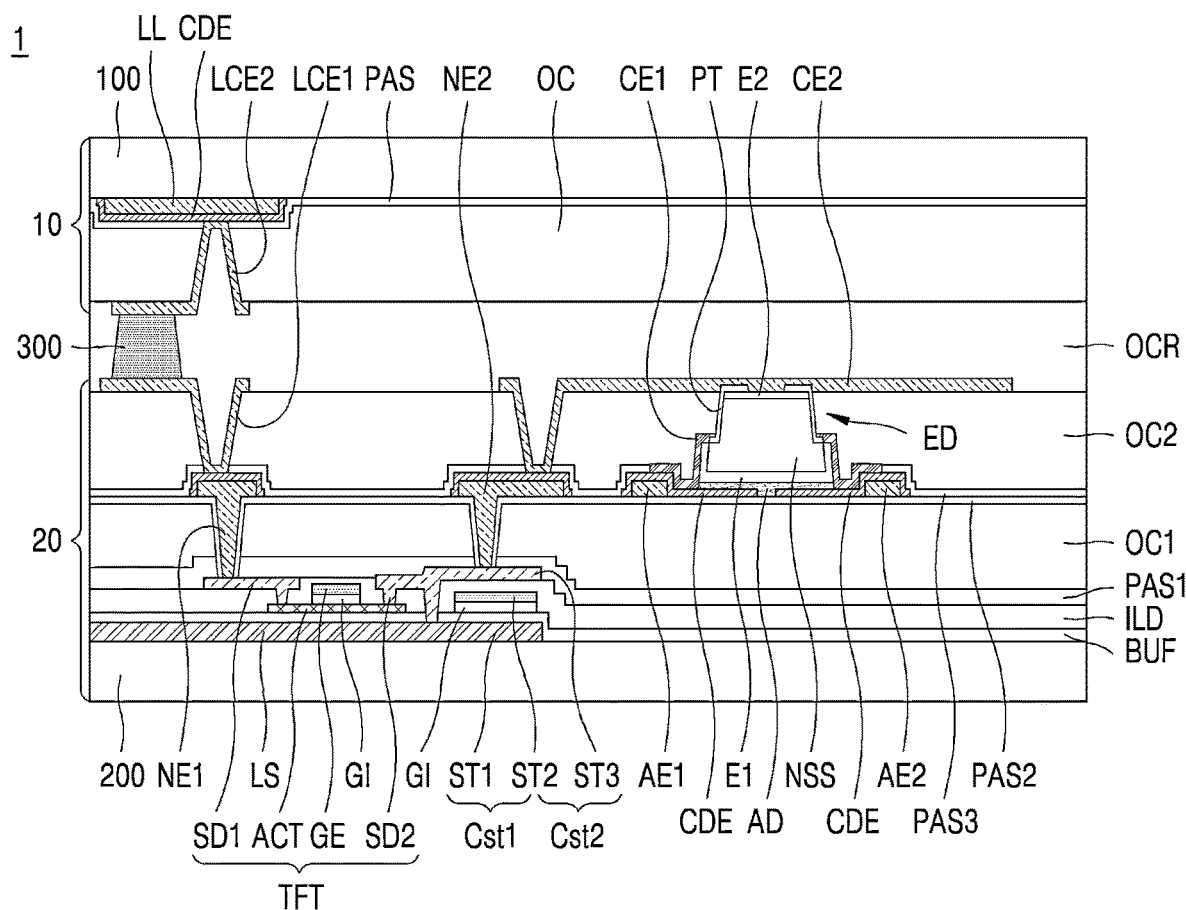
FIG. 15 is a detailed cross-sectional view showing a state in which a panel part and a wiring substrate are connected to each other by a contact member, according to one embodiment of the present disclosure.

FIG. 15 is a detailed cross-sectional view showing a state that the panel unit 20 and the wiring substrate 10 are connected to each other by the contact member according to one embodiment of the present disclosure.

Figure 9:
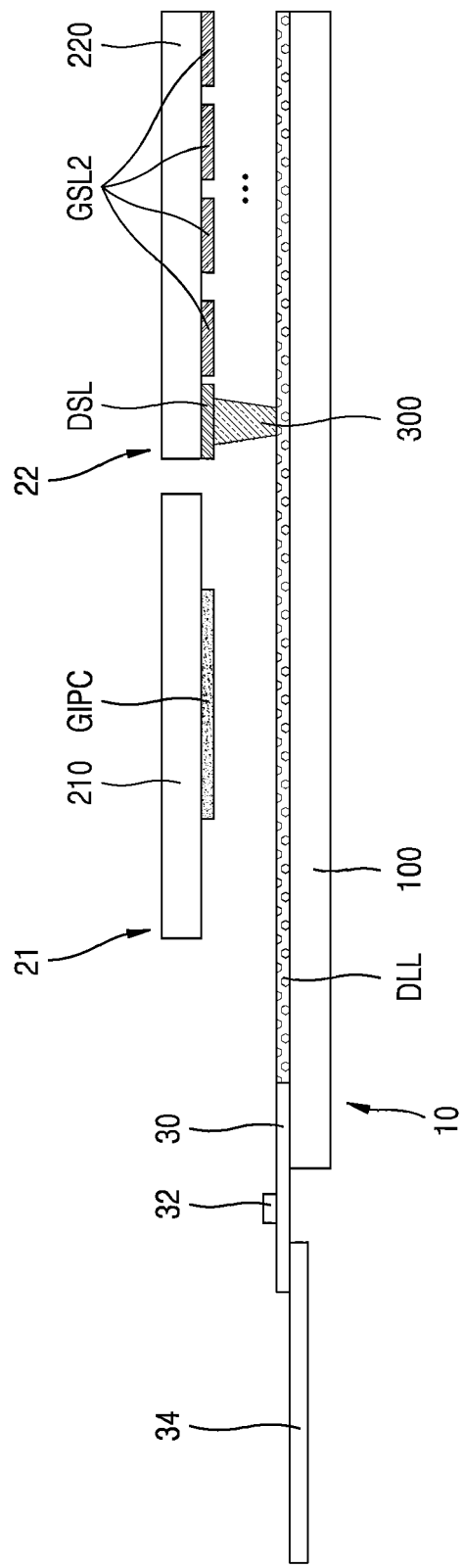
FIG. 9 is a cross-sectional view showing lines transmitting a data signal in a state in which a first panel part and a second panel part are disposed on and attached to a wiring substrate, according to an embodiment of the present disclosure.

Referring to FIG. 9, the wiring substrate 10 and the panel part 20 may be bonded to each other by the optical resin layer OCR disposed between the wiring substrate 10 and the panel part 20, and may be electrically connected to each other by the plurality of members 300.

For example, the optical resin layer OCR may include the optical clear resin (OCR).

Hereinafter, the panel part 20 will be described first, and then the wiring substrate 10 will be described.

The panel part 20 may include the second substrate 200, the thin-film transistor TFT disposed on the second substrate 200, the storage capacitor Cst, and the various lines.

The second substrate 200 may be formed of a transparent material including glass or plastic.

A light-shielding layer LS may be disposed on the second substrate 200 so as to prevent light incident from a bottom of the second substrate 200 to an active layer ACT of the thin-film transistor TFT, such that leakage current may be reduced.

A buffer layer BUF may be disposed on the light-shielding layer LS so as to block or prevent impurities or moisture passing through the second substrate 200.

The thin-film transistor TFT may be disposed on the buffer layer BUF.

The thin-film transistor TFT may be a driving thin-film transistor that provides a driving signal for driving the light-emitting element ED.

The thin-film transistor TFT may include an active layer (or a semiconductor layer) ACT, a first source/drain electrode SD1, a second source/drain electrode SD2, and a gate electrode GE.

A gate insulating layer GI may be disposed between the active layer ACT and the gate electrode GE.

An interlayer insulating layer ILD may be disposed on the active layer ACT and the gate electrode GE. The interlayer insulating layer ILD may have a pair of contact-holes defined therein respectively exposing source and drain areas of the active layer ACT.

The first source/drain electrode SD1 and the second source/drain electrode SD2 may be disposed on the interlayer insulating layer ILD, and may be electrically connected to the active layer ACT by the pair of contact-holes, respectively.

The first source/drain electrode SD1 may be a source electrode, and the second source/drain electrode SD2 may be a drain electrode.

A first data signal line DL1_SL, a second data signal line DL2_SL, and a third data signal line DL3_SL as the signal lines SL formed in the panel part 20, and the first source/drain electrode SD1 and the second source/drain electrode SD2 may be formed of the same material and may be disposed in the same layer. The first data signal line DL1_SL, the second data signal line DL2_SL, and the third data signal line DL3_SL as the signal lines SL formed in or at the panel part 20 may be electrically connected to the first source/drain electrode SD1 and the second source/drain electrode SD2.

The storage capacitor Cst may be spaced apart from the thin-film transistor TFT, and may include a first storage capacitor Cst1 and a second storage capacitor Cst2.

The storage capacitor Cst may store a voltage therein so that the light-emitting element ED continuously maintains the same state for one frame.

The first storage capacitor Cst1 may include a first capacitor electrode ST1 and a second capacitor electrode ST2, while the second storage capacitor Cst2 may include the second capacitor electrode ST2 and a third capacitor electrode ST3.

The first capacitor electrode ST1 may be integrally formed with the light-shielding layer LS.

The second capacitor electrode ST2 may be disposed on the first capacitor electrode ST1, and the second capacitor electrode ST2 may be formed of the same material as a material of the gate electrode GE.

The buffer layer BUF and the gate insulating layer GI may be disposed between the first capacitor electrode ST1 and the second capacitor electrode ST2 and thus may be a dielectric layer constituting the first storage capacitor Cst1.

The third capacitor electrode ST3 may be integrally formed with the second source/drain electrode SD2.

The second source/drain electrode SD2 may be electrically connected to the light-shielding layer LS via (or by or through) a contact-hole extending through the buffer layer BUF and the interlayer insulating layer ILD.

The interlayer insulating layer ILD may be disposed between the second capacitor electrode ST2 and the third capacitor electrode ST3 and may be a dielectric layer constituting the second storage capacitor Cst2.

A first passivation layer PAS1 may be formed to cover the thin-film transistor TFT.

The first passivation layer PAS1 may serve to prevent penetration of impurities or moisture into the thin-film transistor TFT.

A first overcoat layer OC1 may be formed on the first passivation layer PAS1.

The first overcoat layer OC1 may be a first planarization layer, and may serve to reduce a step caused by a lower line such as the thin-film transistor TFT so as to planarize an upper surface.

The first overcoat layer OC1 may include an organic material, for example, a photoactive compound (PAC). However, embodiments of the present disclosure are not limited thereto.

A pair of via-holes or a pair of contact-holes respectively exposing portions of surfaces of the first source/drain electrode SD1 and the second source/drain electrode SD2 may extend through the first overcoat layer OC1 and the first passivation layer PAS1.

A second passivation layer PAS2 including an insulating material may be disposed on the first overcoat layer OC1. The second passivation layer PAS2 may extend along and on an inner side surface of each of the pair of via-holes extending through the first overcoat layer OC1 and the first passivation layer PAS1.

However, the second passivation layer PAS2 may be formed in a pattern so as to expose some portions of the surfaces of the first source/drain electrode SD1 and the second source/drain electrode SD2.

A first source/drain connection electrode NE1 and a second source/drain connection electrode NE2 may be disposed on the second passivation layer PAS2. The first source/drain connection electrode NE1 may be electrically connected to the first source/drain electrode SD1 via one of the pair of via-holes, while the second source/drain connection electrode NE2 may be electrically connected to the second source/drain electrode SD2 via the other of the pair of via-holes.

The first source/drain electrode SD1 and the first source/drain connection electrode NE1 may be interchangeable with each other in terms of a name. Likewise, the second source/drain electrode SD2 and the second source/drain connection electrode NE2 may be interchangeable with each other in terms of a name.

The light-emitting element ED may be disposed on the second passivation layer PAS2.

The present disclosure describes an example in which the light-emitting element ED is directly bonded (or attached) onto the panel part 20 in a self-assembly scheme. However, embodiments of the present disclosure are not limited thereto.

In this case, the panel part 20 may function as a self-assembly substrate capable of fixing the light-emitting element ED thereto in a self-assembly scheme. The panel part 20 may have a self-assembly structure.

A first assembly electrode AE1, a second assembly electrode AE2, a clad electrode CDE, a first line electrode CE1, and an adhesive layer AD may be formed on the second passivation layer PAS2.

The first assembly electrode AE1 and the second assembly electrode AE2 may be spaced apart from each other and may correspond to each of a plurality of light-emitting elements ED assembled in a self-assembly process.

The assembly electrodes AE1 and AE2 may include a transparent electrode material including indium-tin-oxide ITO.

The first assembly electrode AE1 and the second assembly electrode AE2 may generate an electric field therebetween when voltage is applied thereto in the self-assembly process. Thus, the light-emitting element ED which has moved into an assembly space between the first assembly electrode AE1 and the second assembly electrode AE2 may be stably fixed therein.

The clad electrode layer CDE may be formed on the first assembly electrode AE1 and the second assembly electrode AE2. The clad electrode layer CDE may cover the first assembly electrode AE1 and the second assembly electrode AE2.

The first assembly electrode AE1 and the second assembly electrode AE2, and the first source/drain connection electrode NE1 and the second source/drain connection electrode NE2 may be formed of the same material and may be disposed in the same layer.

The clad electrode layer CDE may be also formed on the first source/drain connection electrode NE1 and the second source/drain connection electrode NE2. The clad electrode layer CDE may be disposed to cover the first source/drain connection electrode NE1 and the second source/drain connection electrode NE2.

The clad electrode layer CDE may prevent corrosion of the first assembly electrode AE1 and the second assembly electrode AE2 in the self-assembly process carried out in fluid, such that the electric field for the assembly of the light-emitting element ED may be generated easily.

The clad electrode layer CDE may include copper (Cu).

A spacing between a pair of clad electrode layers CDE respectively formed on the first assembly electrode AE1 and the second assembly electrode AE2 may be smaller than a spacing (or a distance or an interval) between the first assembly electrode AE1 and the second assembly electrode AE2.

Accordingly, an assembly position of the light-emitting element ED disposed in the assembly space formed between the first assembly electrode AE1 and the second assembly electrode AE2 may be more accurately fixed.

A third passivation layer PAS3 may be disposed on the clad electrode layer CDE.

A portion of the third passivation layer PAS3 may cover a partial area of an upper portion of the clad electrode layer CDE and a remaining portion of the third passivation layer PAS3 may cover an entire surface of the second substrate 200.

The third passivation layer PAS3 may be formed to expose an area corresponding to the assembly space formed between the first assembly electrode AE1 and the second assembly electrode AE2.

The assembly space formed in this way may designate a position to which the light-emitting element ED is connected.

The adhesive layer AD may be disposed on a portion of the clad electrode layer CDE corresponding to the assembly space, and the adhesive layer AD may serve to adhesively fix the light-emitting element ED to the clad electrode layer.

The adhesive layer AD may be formed of a thermo-curable material or a photo-curable material. However, embodiments of the present disclosure are not limited thereto.

The light-emitting element ED may be disposed on the adhesive layer AD.

The present disclosure describes an example in which the light-emitting element ED is embodied as a vertical micro-LED. However, embodiments of the present disclosure are not limited thereto, and the light-emitting element ED may be embodied as a horizontal micro-LED.

Alternatively, the light-emitting element ED may be embodied as a micro-LED having a flip chip shape or a micro-LED having a nanorod shape.

The light-emitting element ED may include a semiconductor structure NSS, a first electrode E1, and a second electrode E2.

The first electrode E1 of the light-emitting element ED may be a first cathode electrode, and the second electrode E2 thereof may be a first anode electrode.

The semiconductor structure NSS may be a nitride semiconductor structure, and may include a first semiconductor layer, an active layer disposed on one side (or one portion) of the first semiconductor layer, and a second semiconductor layer.

The first electrode E1 may be disposed on one surface of the first semiconductor layer where the active layer is not disposed, and the second electrode E2 may be disposed on one surface of the second semiconductor layer where the active layer is not disposed.

For example, the first electrode E1 may be formed to extend from one surface of the first semiconductor layer to a portion of a side surface of the first semiconductor layer.

The first semiconductor layer may be configured for supplying electrons to the active layer, and may include a nitride semiconductor including first conductivity type impurities.

For example, the first conductivity-type impurity may include an N-type impurity.

The active layer may include a Multi-Quantum-Well MQW structure. The second semiconductor layer may be configured for injecting holes into the active layer, and may include a nitride semiconductor including second conductivity type impurities.

For example, the second conductivity type impurity may include a P type impurity.

A protective layer pattern PT may be formed to cover at least a portion of an outer surface of the light-emitting element ED. A protective layer pattern PT may be a protective layer, but embodiments of the present disclosure are not limited thereto.

The protective layer pattern PT may serve to prevent damage that may occur to a side surface of the semiconductor structure NSS in a dry etching process to form the semiconductor structure NSS, thereby supplementing the characteristics of the light-emitting element ED.

The other surface of the first semiconductor layer opposite to one surface of the first semiconductor layer on which the active layer is disposed may contact the adhesive layer AD such that the light-emitting element ED may be fixed to the adhesive layer AD.

A first line electrode CE1 disposed to surround the first electrode E1 may be formed on a side surface of the light-emitting element ED and may contact and be electrically connected to the first electrode E1.

One side (or one portion) of the first line electrode CE1 may cover the clad electrode layer CDE, and may contact and be electrically connected to the clad electrode layer CDE.

Further, a second line electrode CE2 may be formed on the light-emitting element ED, and may contact and be electrically connected to the second electrode E2.

A second overcoat layer OC2 may be formed to cover the light-emitting element ED.

The second overcoat layer OC2 may act as a second planarization layer, and may serve to reduce a step caused by an underlying element such as the light-emitting element ED to provide a planarized an upper surface.

The second overcoat layer OC2 may include an organic material, for example, a photoactive compound (PAC). However, embodiments of the present disclosure are not limited thereto.

A first line connection electrode LCE1 and a second line electrode CE2 may be formed on the second overcoat layer OC2.

The first line connection electrode LCE1 and the second line electrode CE2 may be formed of the same material and may be disposed in the same layer.

Each of a pair of contact-holes may extend through the second overcoat layer OC2 and the third passivation layer PAS3 so as to expose a portion of a surface of the clad electrode layer CDE disposed on each of the first source/drain connection electrode NE1 and the second source/drain connection electrode NE2.

Further, the second overcoat layer OC2 may be formed not to cover at least a portion of a surface of the second electrode E2 of the light-emitting element ED so as to be exposed.

Accordingly, the first line connection electrode LCE1 may be electrically connected to the first source/drain connection electrode NE1 via a portion of the clad electrode layer CDE exposed to an outside through one of the contact-holes. The second line electrode CE2 may be electrically connected to the second source/drain connection electrode NE2 via a portion of the clad electrode layer CDE exposed to the outside through the other of the contact-holes.

In this case, the second line electrode CE2 having one side electrically connected to the second source/drain connection electrode NE2 may cover an upper face of the light-emitting element ED so as to be electrically connected to the second electrode E2.

Accordingly, the second line electrode CE2 may be referred to as a first anode connection electrode electrically connected to the second electrode E2 as a first anode electrode.

Thus, the second line electrode CE2 may be electrically connected to the second source/drain electrode SD2 of the thin-film transistor TFT, and the second electrode E2 as the first anode electrode of the light-emitting element ED, such that the driving signal from the thin-film transistor TFT may be applied to the anode electrode of the light-emitting element ED.

The wiring substrate 10 may include the first substrate 100 and the various link lines LL disposed on the first substrate 100.

The first substrate 100 may be formed of a transparent material including glass or plastic.

A clad electrode layer CDE may be formed on the link line LL to cover the link line LL.

A passivation layer PAS may be formed on the clad electrode layer CDE and a portion of the first substrate 100 on which the link line LL is not formed.

An overcoat layer OC may be formed on the passivation layer PAS.

A second line connection electrode LCE2 may be formed on the overcoat layer OC.

A contact hole extending through the overcoat layer OC and the passivation layer PAS may be formed to expose a portion of a surface of the clad electrode layer CDE on the link line LL.

Accordingly, the second line connection electrode LCE2 may be electrically connected to the link line LL via the clad electrode layer CDE, which is exposed to the outside through the contact hole.

The wiring substrate 10 formed in this way may be bonded (or attached) to the panel part 20 by the optical resin layer OCR disposed therebetween. The wiring substrate 10 and the panel part 20 may be electrically connected to each other by the plurality of contact members 300.

A display apparatus according to various embodiments of the present disclosure may be described as follows.

A display apparatus according to various embodiments of the present disclosure may comprise a wiring substrate including a plurality of pixel gate link lines, at least one first panel part disposed on the wiring substrate including a plurality of GIP circuit parts, and electrically connected to the pixel gate link lines, and at least one second panel part disposed on the wiring substrate including a plurality of pixels and electrically connected to the pixel gate link lines. A gate signal output from the first panel part may be transmitted to the second panel part by the pixel gate link lines.

According to various embodiments of the present disclosure, the at least one first panel part and the at least one second panel part may be arranged in a tiling manner and may be attached onto the wiring substrate.

According to various embodiments of the present disclosure, the display apparatus may further comprise a circuit film connected to one portion of the wiring substrate and a plurality of GIP gate link lines disposed in the wiring substrate and configured to receive a gate control signal from the circuit film. The GIP gate link lines may be electrically connected to the first panel part.

According to various embodiments of the present disclosure, the display apparatus may further comprise a plurality of data link lines disposed in the wiring substrate and configured to receive a data signal from the circuit film. The data link lines may be electrically connected to the second panel part.

According to various embodiments of the present disclosure, the display apparatus may further comprise a circuit film connected to one portion of the first panel part and a plurality of first gate signal input lines disposed in the first panel part and configured to receive a gate control signal from the circuit film. The first gate signal input line may transmit the gate control signal to the GIP circuit part.

According to various embodiments of the present disclosure, the display apparatus may further comprise a plurality of data signal input lines disposed in the first panel part and configured to receive a data signal from the circuit film and a plurality of data link lines disposed in the wiring substrate and electrically connected to the second panel part. The data signal input line may be electrically connected to the data link line.

A display apparatus according to various embodiments of the present disclosure may comprise a wiring substrate including a plurality of first gate link lines and a plurality of second gate link lines, a circuit film disposed on one portion of the wiring substrate and configured to transmit a gate control signal to the plurality of first gate link lines, at least one first panel part disposed on the wiring substrate, one portion of the at least one first panel part being electrically connected to the first gate link lines, and the other portion thereof being electrically connected to the second gate link lines; and at least one second panel part disposed on the wiring substrate and electrically connected to the second gate link lines.

According to various embodiments of the present disclosure, the first panel part may include a plurality of GIP circuit parts and a plurality of first gate signal lines configured to transmit the gate control signal to the plurality of GIP circuit parts.

According to various embodiments of the present disclosure, the first gate signal line may include a first gate signal input line and a first gate signal output line. One portion of the first gate signal input line may be electrically connected to the GIP circuit part, and the other portion thereof may be electrically connected to the first gate link line. One portion of the first gate signal output line may be electrically connected to the GIP circuit part and the other portion thereof may be electrically connected to the second gate link line.

According to various embodiments of the present disclosure, the second panel part may include a plurality of pixels and a plurality of second gate signal lines transmitting a gate signal to the pixels. The second gate signal line may be electrically connected to the second gate link line.

According to various embodiments of the present disclosure, a plurality of data link lines may be disposed in the wiring substrate and configured to receive a data signal from the circuit film. The second panel part may further include a plurality of data signal lines configured to apply the data signal to the pixels. The data signal line may be electrically connected to the data link line.

According to various embodiments of the present disclosure, the first panel part may be disposed between the circuit film and the second panel part.

According to various embodiments of the present disclosure, the display apparatus may further comprise a contact member between the first panel part and the first gate link line; and another contact member between the first panel part and the second gate link line. The first panel part may be electrically connected to the first gate link line and the second gate link line.

A display apparatus according to various embodiments of the present disclosure may comprise a wiring substrate including a plurality of gate link lines, at least one first panel part disposed on the wiring substrate and electrically connected to the gate link lines, a circuit film connected to one portion of the first panel part and configured to transmit a gate control signal to the first panel part, and at least one second panel part disposed on the wiring substrate and electrically connected to the gate link lines.

According to various embodiments of the present disclosure, the first panel part may include a plurality of GIP circuit parts and a plurality of first gate signal lines configured to transmit the gate control signal to the plurality of GIP circuit part.

According to various embodiments of the present disclosure, the first gate signal line may include a first gate signal input line and a first gate signal output line. One portion of the first gate signal input line may be electrically connected to the GIP circuit part, and the other portion thereof may be electrically connected to the circuit film. One portion of the first gate signal output line may be electrically connected to the GIP circuit part and the other portion thereof may be electrically connected to the gate link line.

According to various embodiments of the present disclosure, the second panel part may include a plurality of pixels and a plurality of second gate signal lines configured to apply a gate signal to the pixels. The second gate signal line may be electrically connected to the gate link line.

According to various embodiments of the present disclosure, the first panel part may further include a data signal input line configured to receive a data signal from the circuit film. A plurality of data link lines may be disposed in the wiring substrate and may be electrically connected to the data signal input line. The second display panel may further include a plurality of data signal lines configured to apply a data signal to the pixels. The data signal line may be electrically connected to the data link line.

According to various embodiments of the present disclosure, the first panel part may be disposed between the circuit film and the second panel part.

According to various embodiments of the present disclosure, the display apparatus may further comprise a contact member between the first panel part and the gate link line. The contact member may be electrically connected the first panel part to the gate link line.

It will be apparent to those skilled in the art that various modifications and variations can be made in the display apparatus of the present disclosure without departing from the technical idea or scope of the present disclosure. Thus, it is intended that the present disclosure cover the modifications and variations of this disclosure provided that within the scope of the claims and their equivalents.

What is claimed is:

1. A tiling display apparatus, comprising:
    a wiring substrate including a plurality of pixel gate link lines formed on a first substrate;
    at least one first panel part on the wiring substrate including a plurality of gate-in-panel (GIP) circuit parts formed on a first base substrate, the at least one first panel part electrically connected to the plurality of pixel gate link lines; and
    at least one second panel part on the wiring substrate including a plurality of pixels formed on a second base substrate, the at least one second panel part electrically connected to the plurality of pixel gate link lines,
    wherein the at least one first panel part and the at least one second panel part are attached to the wiring substrate in a tiling manner.

2. The tiling display apparatus of claim 1, further comprising:
    a circuit film connected to one portion of the wiring substrate; and
    a plurality of GIP gate link lines in the wiring substrate, the plurality of GIP gate link lines configured to receive a gate control signal from the circuit film,
    wherein the plurality of GIP gate link lines are electrically connected to the at least one first panel part.

3. The tiling display apparatus of claim 2, further comprising:
    a plurality of data link lines in the wiring substrate, the plurality of data link lines configured to receive a data signal from the circuit film, wherein the plurality of data link lines are electrically connected to the at least one second panel part.

4. The tiling display apparatus of claim 1, further comprising:
    a circuit film connected to one portion of the at least one first panel part; and
    a plurality of first gate signal input lines in the at least one first panel part, the plurality of first gate signal input lines configured to receive a gate control signal from the circuit film,
    wherein a first gate signal input line of the plurality of first gate signal input lines transmits the gate control signal to a GIP circuit part from the plurality of GIP circuit parts.

5. The tiling display apparatus of claim 4, further comprising:
    a plurality of data signal input lines in the at least one first panel part, the plurality of data signal input lines configured to receive a data signal from the circuit film; and
    a plurality of data link lines in the wiring substrate, the plurality of data link lines electrically connected to the at least one second panel part,
    wherein a data signal input line of the plurality of data signal input lines is electrically connected to a data link line of the plurality of data link lines.

6. A tiling display apparatus, comprising:
    a wiring substrate including a plurality of first gate link lines and a plurality of second gate link lines formed on a first substrate;
    a circuit film on one portion of the wiring substrate, the circuit film configured to transmit a gate control signal to the plurality of first gate link lines;
    at least one first panel part on the wiring substrate, the at least one first panel part including a first base substrate, one portion of the at least one first panel part is electrically connected to the plurality of first gate link lines, and another portion of the at least one first panel part is electrically connected to the plurality of second gate link lines; and
    at least one second panel part on the wiring substrate, the at least one second panel part including a second base substrate, the at least one second panel part electrically connected to the plurality of second gate link lines,
    wherein the at least one first panel part and the at least one second panel part are attached to the wiring substrate in a tiling manner.

7. The tiling display apparatus of claim 6, wherein the at least one first panel part includes:
    a plurality of gate-in-panel (GIP) circuit parts; and
    a plurality of first gate signal lines that transmit the gate control signal to the plurality of GIP circuit parts.

8. The tiling display apparatus of claim 7, wherein a first gate signal line from the plurality of first gate signal lines includes a first gate signal input line and a first gate signal output line, wherein one portion of the first gate signal input line is electrically connected to a GIP circuit part from the plurality of GIP circuit parts, and another portion of the first gate signal input line is electrically connected to a first gate link line from the plurality of first gate link lines, and wherein one portion of the first gate signal output line is electrically connected to the GIP circuit part and another portion of the first gate signal output line is electrically connected to a second gate link line from the plurality of second gate link lines.

9. The tiling display apparatus of claim 6, wherein the at least one second panel part includes:
a plurality of pixels; and
a plurality of second gate signal lines transmitting a gate signal to the plurality of pixels, and
wherein a second gate signal line of the plurality of second gate signal lines is electrically connected to a second gate link line of the plurality of second gate link lines.

10. The tiling display apparatus of claim 9, wherein a plurality of data link lines are in the wiring substrate, the plurality of data link lines configured to receive a data signal from the circuit film,
wherein the at least one second panel part further includes a plurality of data signal lines configured to apply the data signal to the plurality of pixels, and
wherein a data signal line of the plurality of data signal lines is electrically connected to a data link line of the plurality of data link lines.

11. The tiling display apparatus of claim 6, wherein the at least one first panel part is between the circuit film and the at least one second panel part.

12. The tiling display apparatus of claim 6, further comprising:
a first contact member between the at least one first panel part and a first gate link line of the plurality of first gate link lines; and
a second contact member between the at least one first panel part and a second gate link line of the plurality of second gate link lines,
wherein the at least one first panel part is electrically connected to the first gate link line and the second gate link line.

13. A tiling display apparatus, comprising:
a wiring substrate including a plurality of gate link lines formed on a first substrate;
at least one first panel part on the wiring substrate, the at least one first panel part including a first base substrate, the at least one first panel part electrically connected to the plurality of gate link lines;
a circuit film connected to one portion of a first panel part of the at least one first panel part, the circuit film configured to transmit a gate control signal to the at least one first panel part; and
at least one second panel part on the wiring substrate, the at least one second panel part including a second base substrate, the at least one second panel part electrically connected to the plurality of gate link lines,
wherein the at least one first panel part and the at least one second panel part are attached to the wiring substrate in a tiling manner.

14. The tiling display apparatus of claim 13, wherein the at least one first panel part includes:
a plurality of GIP circuit parts; and
a plurality of first gate signal lines configured to transmit the gate control signal to the plurality of GIP circuit parts.

15. The tiling display apparatus of claim 14, wherein a first gate signal line of the plurality of first gate signal lines includes a first gate signal input line and a first gate signal output line,
wherein one portion of the first gate signal input line is electrically connected to a GIP circuit part of the plurality of GIP circuit parts, and another portion of the first gate signal input line is electrically connected to the circuit film, and
wherein one portion of the first gate signal output line is electrically connected to the GIP circuit part and another portion of the first gate signal output line is electrically connected to a gate link line of the plurality of gate link lines.

16. The tiling display apparatus of claim 13, wherein a second panel part of the at least one second panel part includes:
a plurality of pixels; and
a plurality of second gate signal lines configured to apply a gate signal to the plurality of pixels, and
wherein a second gate signal line of the plurality of second gate signal lines is electrically connected to a gate link line of the plurality of gate link lines.

17. The tiling display apparatus of claim 16, wherein the first panel part of the at least one first panel part further includes a data signal input line configured to receive a data signal from the circuit film,
wherein a plurality of data link lines are in the wiring substrate, the plurality of data link lines electrically connected to the data signal input line,
wherein the second panel part of the at least one second panel part further includes a plurality of data signal lines configured to apply a data signal to the plurality of pixels, and
wherein a data signal line of the plurality of data signal lines is electrically connected to a data link line of the plurality of data link lines.

18. The tiling display apparatus of claim 13, wherein the at least one first panel part is between the circuit film and the at least one second panel part.

19. The tiling display apparatus of claim 13, further comprising:
a contact member between the at least one first panel part and a gate link line of the plurality of gate link lines, wherein the contact member is electrically connected the at least one first panel part to the gate link line.

* * * * *